United States Patent
Shen et al.

(10) Patent No.: US 8,407,561 B2
(45) Date of Patent: *Mar. 26, 2013

(54) FORMULAIC FLEXIBLE COLLISION-FREE MEMORY ACCESSING FOR PARALLEL TURBO DECODING WITH QUADRATIC POLYNOMIAL PERMUTATION (QPP) INTERLEAVE

(75) Inventors: Ba-Zhong Shen, Irvine, CA (US); Tak K. Lee, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/293,231

(22) Filed: Nov. 10, 2011

(65) Prior Publication Data

US 2012/0054578 A1    Mar. 1, 2012

Related U.S. Application Data

(63) Continuation of application No. 11/810,991, filed on Jun. 7, 2007, now Pat. No. 8,065,588.

(60) Provisional application No. 60/880,835, filed on Jan. 17, 2007, provisional application No. 60/897,653, filed on Jan. 26, 2007.

(51) Int. Cl.
   *G11C 29/00* (2006.01)
(52) U.S. Cl. .......................... 714/763; 714/773
(58) Field of Classification Search .................. 714/763, 714/773
   See application file for complete search history.

(56) References Cited

U.S. PATENT DOCUMENTS

| 6,603,412 B2* | 8/2003 | Gatherer et al. ................ 341/61 |
| 7,305,593 B2* | 12/2007 | Andreev et al. ............... 714/701 |
| 2010/0146371 A1* | 6/2010 | Efimov et al. ................. 714/780 |

OTHER PUBLICATIONS

Flexible and Formulaic Collision-Free Memory Accessing for Parallel Turbo Decoding with Quadratic Polynomial Permutation (QPP) Interleave; 3GPP Draft; R1-070618_Flexiible_QPP 3rd Generation Partnership Project (3GPP), Mobile Competence Centre; vol. RAN WG1, No. Sorrento, Italy; Jan. 20, 2007; pp. 1-5.

\* cited by examiner

*Primary Examiner* — M. Mujtaba K Chaudry
(74) *Attorney, Agent, or Firm* — Garlick & Markison; Shayne X. Short

(57) ABSTRACT

Formulaic flexible collision-free memory accessing for parallel turbo decoding with quadratic polynomial permutation (QPP) interleave. A means is presented by which any desired number of parallel implemented turbo decoding processors can be employed to perform turbo decoding that has been performed using a QPP interleave. This approach is presented to allow an arbitrarily selected number (M) of decoding processors (e.g., a plurality of parallel implemented turbo decoders) to perform decoding of a turbo coded signal while still using a selected embodiment of a QPP interleave. In addition, a collision-free memory mapping, ($\mathcal{M}_{MOD,C,W}$) provides more freedom for selecting the particular quadratic polynomial permutation (QPP) interleave ($\pi$) that satisfies a parallel turbo decoding implementation with any desired number of parallel implemented turbo decoding processors. This memory mapping allows collision-free reading and writing of updated information (as updated using parallel implemented turbo decoder) into memory banks.

20 Claims, 16 Drawing Sheets

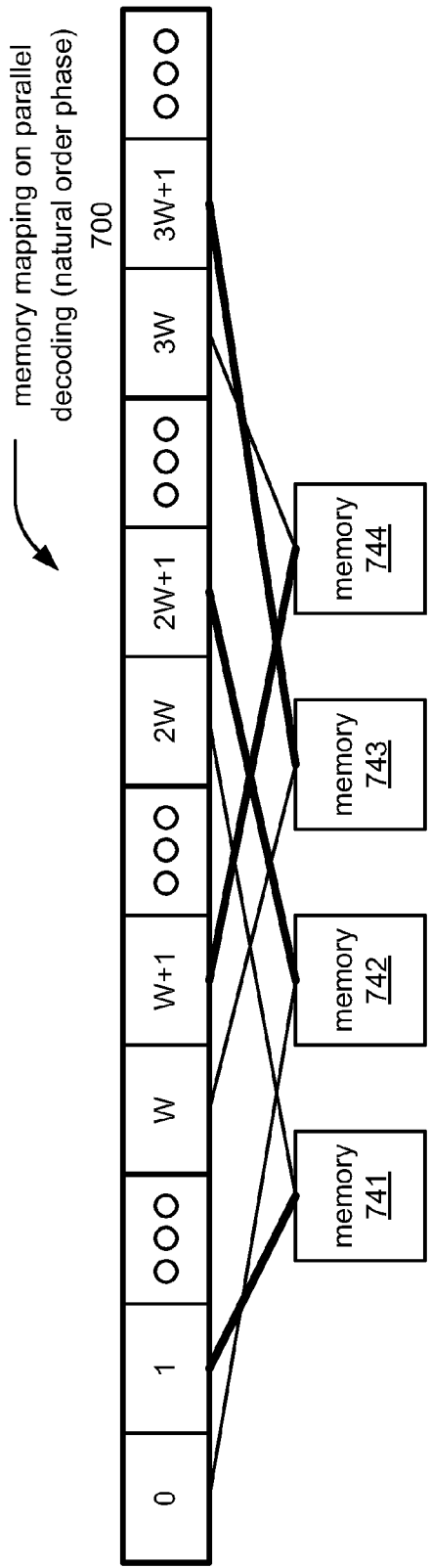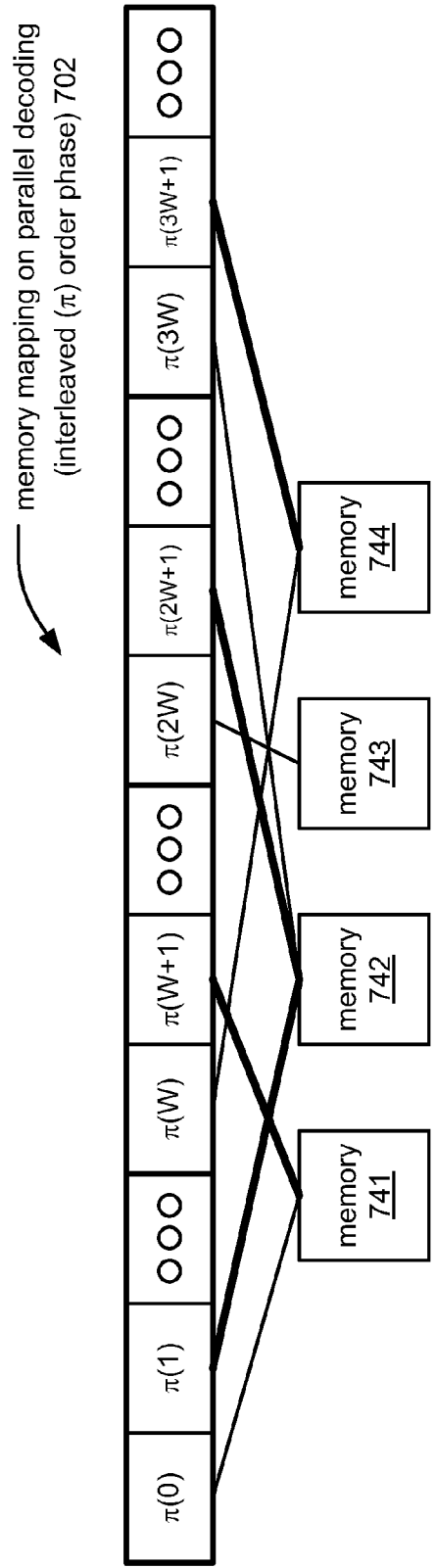

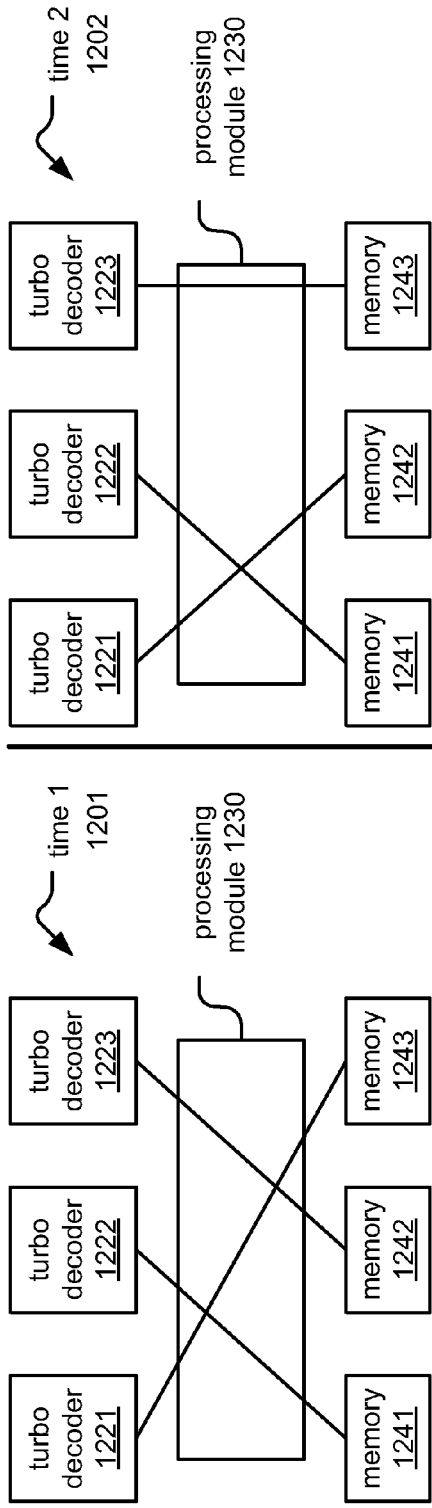
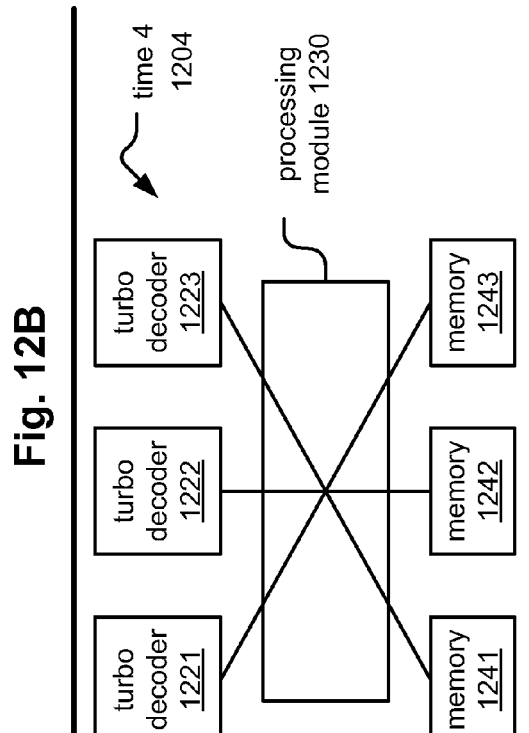
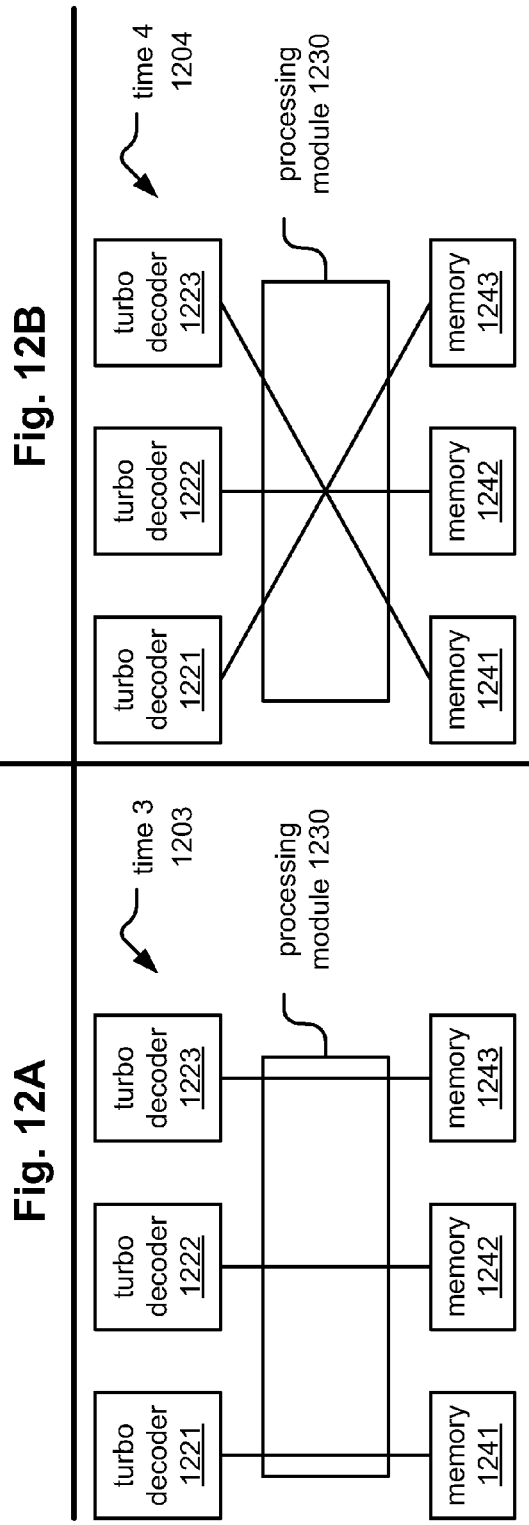

FORMULAIC FLEXIBLE COLLISION-FREE MEMORY ACCESSING FOR PARALLEL TURBO DECODING WITH QUADRATIC POLYNOMIAL PERMUTATION (QPP) INTERLEAVE

CROSS REFERENCE TO RELATED PATENTS/PATENT APPLICATIONS

Continuation Priority Claim, 35 U.S.C. §120

The present U.S. Utility patent application claims priority pursuant to 35 U.S.C. §120, as a continuation, to the following U.S. Utility patent application which is hereby incorporated herein by reference in its entirety and made part of the present U.S. Utility patent application for all purposes:

1. U.S. Utility patent application Ser. No. 11/810,991, entitled "Formulaic flexible collision-free memory accessing for parallel turbo decoding with quadratic polynomial permutation (QPP) interleave," filed Jun. 7, 2007, pending, and scheduled to be issued as U.S. Pat. No. 8,065,588 on Nov. 22, 2011 (as indicated in an ISSUE NOTIFICATION mailed on Nov. 2, 2011), which claims priority pursuant to 35 U.S.C. §119(e) to the following U.S. Provisional Patent Applications which are hereby incorporated herein by reference in their entirety and made part of the present U.S. Utility patent application for all purposes:

a. U.S. Provisional Application Ser. No. 60/880,835, entitled "Formulaic flexible collision-free memory accessing for parallel turbo decoding with quadratic polynomial permutation (QPP) interleave," filed Jan. 17, 2007, now expired.

b. U.S. Provisional Application Ser. No. 60/897,653, entitled "Quadratic polynomial permutation (QPP) interleaver providing hardware savings and flexible granularity adaptable to any possible turbo code block size," filed Jan. 26, 2007, now expired.

Incorporation by Reference

The following U.S. Utility patent application is hereby incorporated herein by reference in its entirety and made part of the present U.S. Utility patent application for all purposes:

1. U.S. Utility patent application Ser. No. 11/810,890, entitled "Quadratic polynomial permutation (QPP) interleaver providing hardware savings and flexible granularity adaptable to any possible turbo code block size," filed Jun. 07, 2007, now issued as U.S. Pat. No. 7,975,203 on Jul. 5, 2011.

BACKGROUND OF THE INVENTION

1. Technical Field of the Invention

The invention relates generally to communication systems; and, more particularly, it relates to communication systems employing turbo coding.

2. Description of Related Art

Data communication systems have been under continual development for many years. One such type of communication system that has been of significant interest lately is a communication system that employs iterative error correction codes. Of those, one particular type of communication system that has received interest in recent years has been one which employs turbo codes (one type of iterative error correcting code). Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

The use of turbo codes providing such relatively lower error rates, while operating at relatively low data throughput rates, has largely been in the context of communication systems having a large degree of noise within the communication channel and where substantially error free communication is held at the highest premium. Some of the earliest application arenas for turbo coding were space related where accurate (i.e., ideally error free) communication is often deemed an essential design criterion. The direction of development then moved towards developing terrestrial-applicable and consumer-related applications. Still, based on the heritage of space related application, the focus of effort in the turbo coding environment then continued to be achieving relatively lower error floors, and not specifically towards reaching higher throughput.

More recently, focus in the art has been towards developing turbo coding, and variants thereof, that are operable to support higher amounts of throughput while still preserving the relatively low error floors offered within the turbo code context.

In fact, as the throughput requirement in communication systems increases, parallel turbo decoding, which employs a plurality of processors and a plurality of memory banks, become necessary. Many of the current systems support a wide range of codeword sizes. Thus, efficiency and flexibility in parallel turbo decoder design is of critical importance.

Generally speaking, within the context of communication systems that employ turbo codes, there is a first communication device at one end of a communication channel with encoder capability and second communication device at the other end of the communication channel with decoder capability. In many instances, one or both of these two communication devices includes encoder and decoder capability (e.g., within a bi-directional communication system).

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 7A illustrates an embodiment of memory mapping on parallel decoding for natural/non-interleaved order phase.

FIG. 7B illustrates an embodiment of memory mapping on parallel decoding for interleaved (π) order (showing collision in one of the memories).

FIG. 12A, FIG. 12B, FIG. 12C, and FIG. 12D illustrates various, successive collision-free memory mappings between turbo decoders and memories.

DETAILED DESCRIPTION OF THE INVENTION

Figure 1:
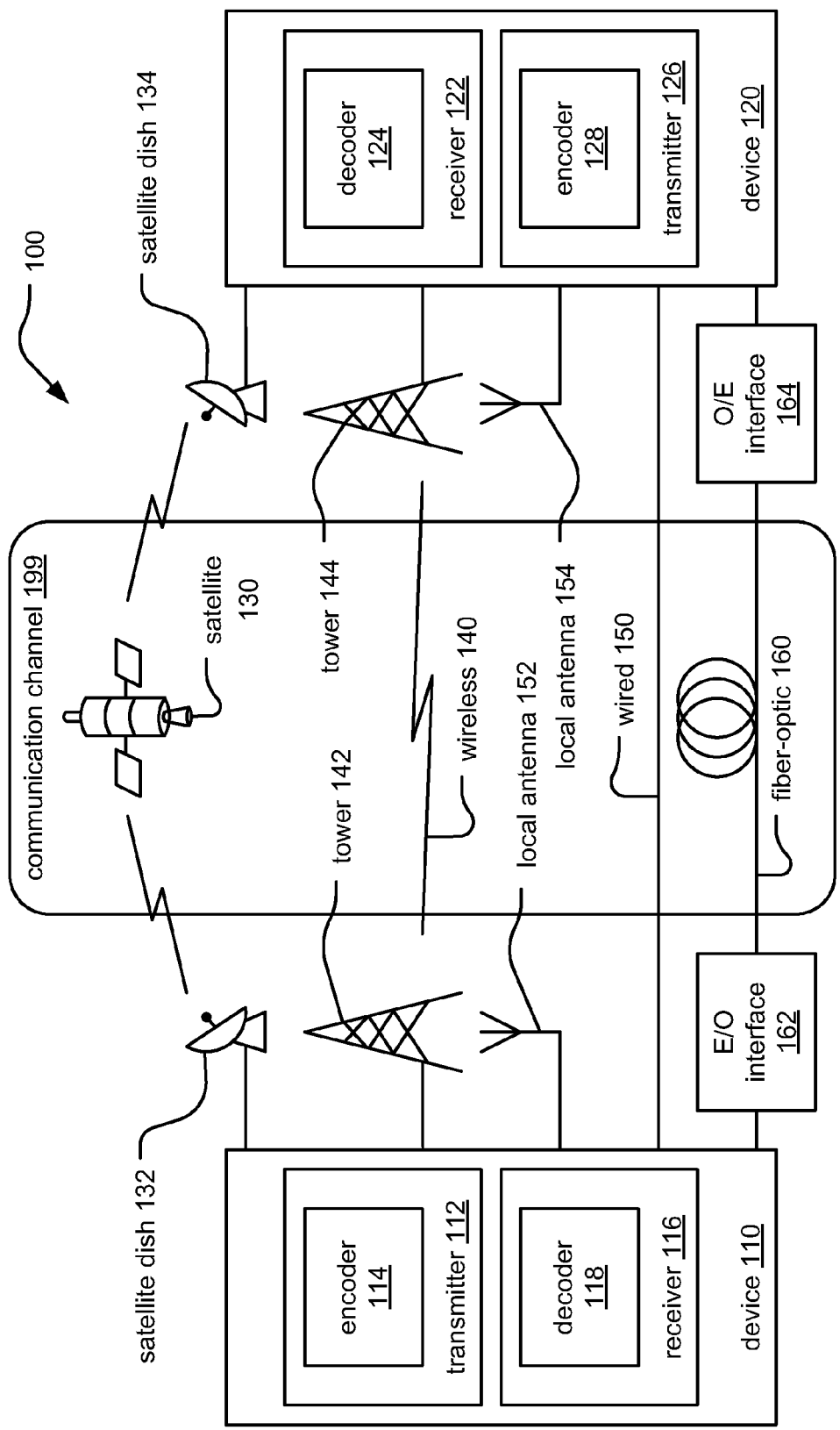
FIG. 1 illustrates an embodiment of a communication system.

Many communication systems incorporate the use of a turbo code. While there are many potential applications that can employ turbo codes, means are presented herein that can be applied to the 3GPP channel code to support an arbitrary number of information bits. Some examples of the number of bits that can be supported using the various aspects of the invention presented herein are 40 to 5114 for WCDMA and HSDPA and more for LTE.

Additional information regarding the UTRA-UTRAN Long Term Evolution (LTE) and 3GPP System Architecture Evolution (SAE) can be found at the following Internet web site:

www.3gpp.org

Turbo coding was suggested for 3GPP LTE channel coding. Within the channel coding system in 3GPP LTE, there is a need and desire to supply and provide for a wide range of block sizes (i.e., turbo code block lengths). For this coding system, the algebraic interleave referred to as the "almost regular permutation (ARP)" in reference [1] is considered as one of the candidates, and "quadratic polynomial permutation (QPP)" in reference [2] is considered as an alternative candidate.

Furthermore, the turbo decoding of this system generally needs to be implemented using a parallel decoding arrangement because of the very high data throughput and large block size desired for 3GPP LTE channel coding. The parallel decoding requires the collision-free memory accessing (i.e., any one turbo decoder (of a group of parallel arranged turbo decoders) accesses only memory (of a group of parallel arranged memories) at any given time). In parallel turbo decoding, the decoding processing involves the processing of windows that together compose the entire turbo code block. For example, the decoding approach is windowed in nature, in that, the entire turbo code block is divided into some sub-blocks and performing shorter recursions inside the sub-block. In a parallel decoding arrangement that includes multiple turbo decoding processors (e.g., sometimes referred to as processors) working in parallel, and each of sub-blocks is assigned to a distinct decoding processor. Since every processor uses the same decoding approach, each of the processors accesses the memory at the same time instants. If there is an ineffectual memory mapping ($\mathcal{M}$) then there can be collisions; that is to say, two (or more) memory accesses from 2 or more processors are attempted at the same time to the same memory bank (e.g., see FIG. 7A, FIG. 7B, FIG. 8 and FIG. 9 below, and their associated written description, among other descriptions of collision vs. collision-free memory mapping in the context of parallel turbo decoding). The collisions caused by an ineffectual memory mapping ($\mathcal{M}$) between memories and processors will weaken the efficiency of the decoding implementation. In reference [3], it is shown that there always exists collision-free memory accessing for parallel decoding of any degree and for any interleave (π). However, in general, the method given in reference [3] is somehow ad-hoc and is generally not implementation-friendly, especially when many different block sizes have to be supported such as in the context of 3GPP LTE channel coding.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

FIG. 1 is a diagram illustrating an embodiment of a communication system 100.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

Figure 2:
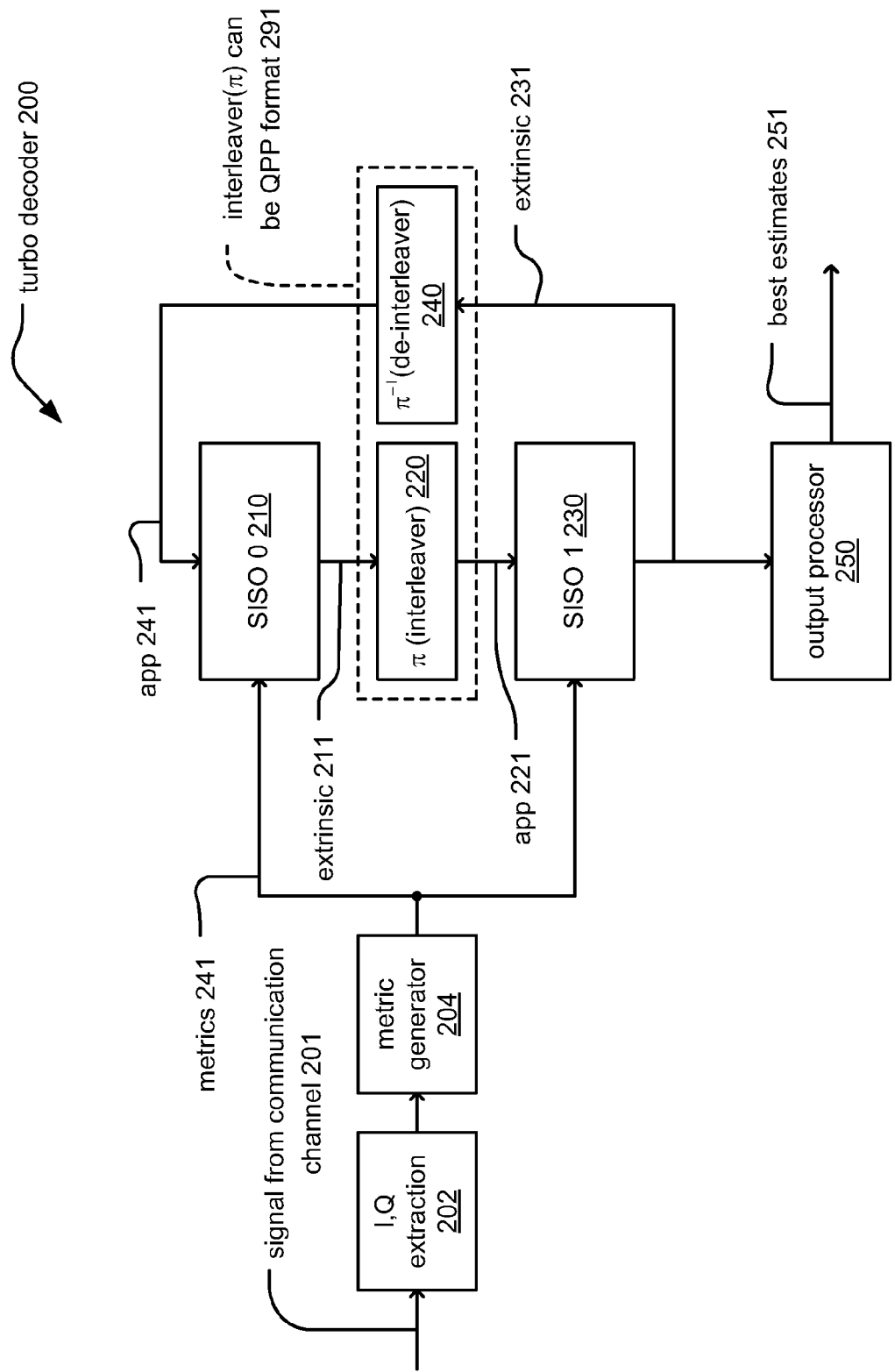
FIG. 2 illustrates an embodiment of a turbo decoder.

FIG. 2 illustrates an embodiment of a turbo decoder 200. A received signal (e.g., typically received from a communication channel) is provided to an I,Q extraction module 202 that extracts the I,Q (in-phase and quadrature) components from the received signal 201. This may be viewed as being receiver pre-processing, and it can include any appropriate frequency conversion (typically down-conversion from a carrier frequency, if needed). The I,Q can then be mapped according to the modulation's appropriate constellation and mapping.

Then, the mapped I,Q is passed to a metric generator 204. The metric generator 204 generates the appropriate metrics 241 that are measured from the received I,Q to the constellation points within the modulation's appropriate constellation and mapping; the metrics are indexed by the mapping of the constellation points within the modulation; these metrics may be viewed as being the scaled Euclidian distances from the location of the actual received symbol to the expected constellation point locations within the modulation.

Continuing on with the turbo decoding process and functionality, the metrics 241 that are calculated by the metric generator 204 are then provided simultaneously to a first soft-in/soft-out (SISO 0) decoder 210 and a second SISO 1 decoder 230. In the context of trellis coding (e.g., turbo trellis coded modulation (TTCM)), each of the first SISO 0 decoder 210 and the second SISO 1 decoder 230 calculates forward metrics (alphas) and backward metrics (betas), and extrinsic values according to the trellis employed.

These alphas, betas, and extrinsics are all calculated for each symbol within a frame that is to be decoded. These calculations of alphas, betas, and extrinsics are all based on the trellis.

Starting with the first SISO 0 decoder 210, after the extrinsic values 211 have been calculated, they are passed to an interleaver (π) 220 after which it is passed to the second SISO 1 decoder 230 as "a priori probability" (app) information 221. Similarly, after extrinsic values 231 have been calculated within the second SISO 1 decoder 230, they are passed to a de-interleaver ($\pi^{-1}$) 240 after which it is passed to the first SISO 0 decoder 210 as "a priori probability" (app) information 241. It is noted that a single decoding iteration, within the iterative decoding process of the turbo decoder 200 consists of performing two SISO operations; that is to say, the iterative decoding process must pass through both the first SISO 0 decoder 210 and through the second SISO 1 decoder 230.

After a significant level of confidence has been achieved and a solution is being converged upon, or after a predetermined number of decoding iterations have been performed, then the output from the second SISO 1 decoder 230 is passed as output to an output processor 250. The operation of the SISOs 210 and 230 may generally be referred to as calculating soft symbol decisions of the symbol contained within the received symbol. These soft symbol decisions may be performed on a true bit level in certain embodiments. The output processor 250 uses these soft symbol decisions to generate best estimates 251 (e.g., hard bit and/or symbol decisions) for the information bits that have been encoded within the original turbo coded signal (e.g., generally within a turbo encoder location at another end of a communication channel into which the signal 201 was originally launched.

It is also noted that the interleaving performed within the interleaver (π) 220 can be performed using an embodiment of a QPP interleave, as shown by reference numeral 291.

Many of the embodiments presented herein employ various embodiments of the quadratic polynomial permutation (QPP) interleave. Even more details are provided below with respect to the means by which to perform QPP interleaving.

Figure 3:
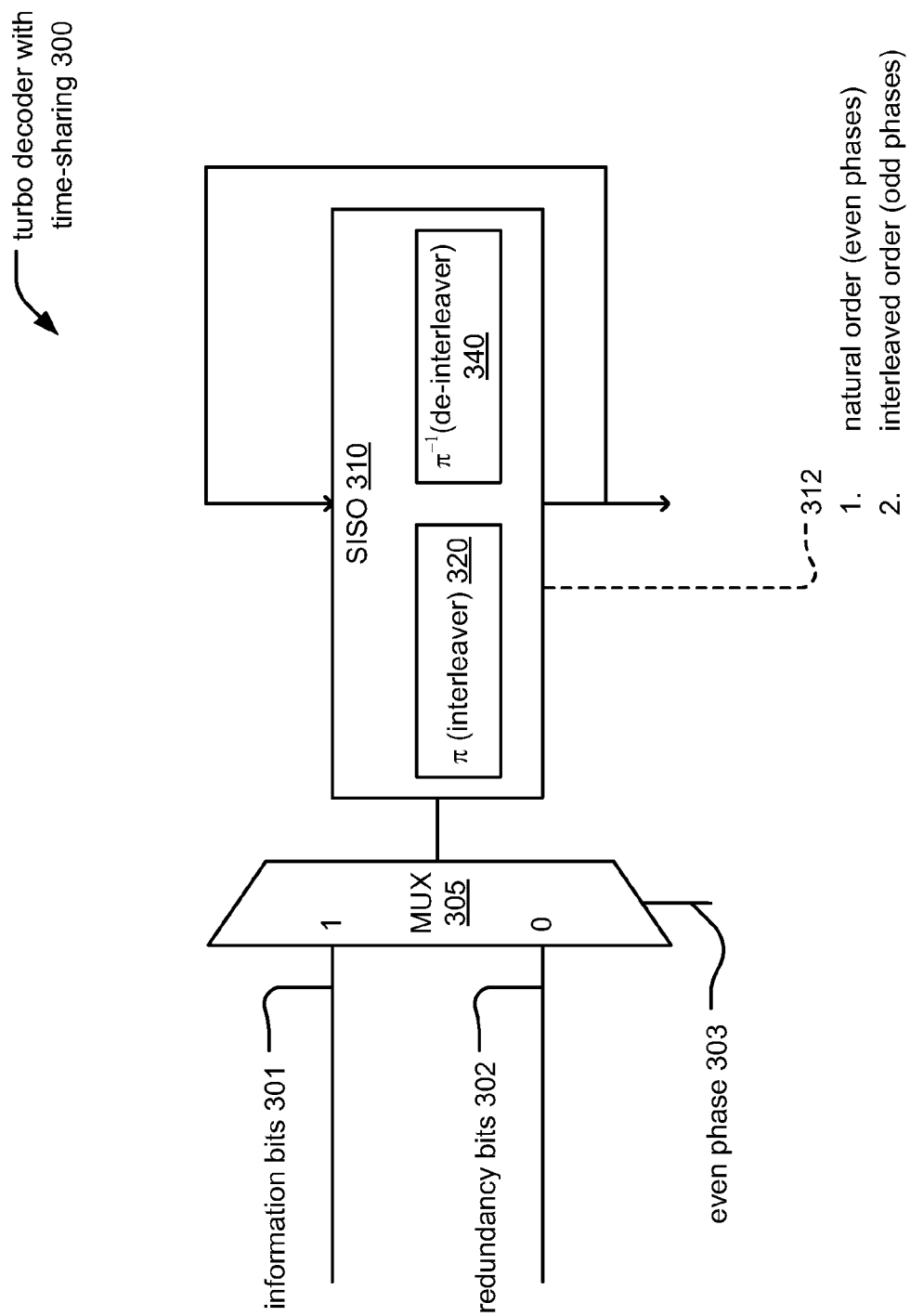
FIG. 3 illustrates an embodiment of a turbo decoder with time-sharing that is operable to employ a single soft-in/soft-out (SISO) decoder or a single array of SISO decoders.

FIG. 3 illustrates an embodiment of a turbo decoder with time-sharing that is operable to employ a single soft-in/soft-out (SISO) decoder or a single array of SISO decoders. This embodiment employs a single SISO decoder or single array of SISO decoders to perform both the SISO 0 and the SISO 1 decoding operations in accordance with turbo decoding processing (or parallel turbo decoding processing). A MUX 305 is operable to receive both information bits 301 and redundancy bits 302 and selectively to provide them to a SISO decoder 310. The SISO decoder 310 of this embodiment also includes an integrated interleaver (π) 320 and integrated de-interleaver ($\pi^{-1}$) 340. The select signal of the MUX 305 operates according to a signal whose even phase 303 governs the selection of either the information bits 301 or redundancy bits 302 to be provided to the SISO decoder 310 to perform either SISO 0 decoding processing or SISO 1 decoding processing.

In one embodiment, as depicted by reference numeral 312, when performing the natural order phase decoding (e.g., SISO 0 decoding operations), the accessing of memory entries is performed when the select signal 303 indicates an even phase to the MUX 306. Also, when performing the interleaved (π) order phase decoding (e.g., SISO 1 decoding operations), the accessing of memory entries is performed when the select signal 303 indicates an odd phase to the MUX 306.

Figure 4:
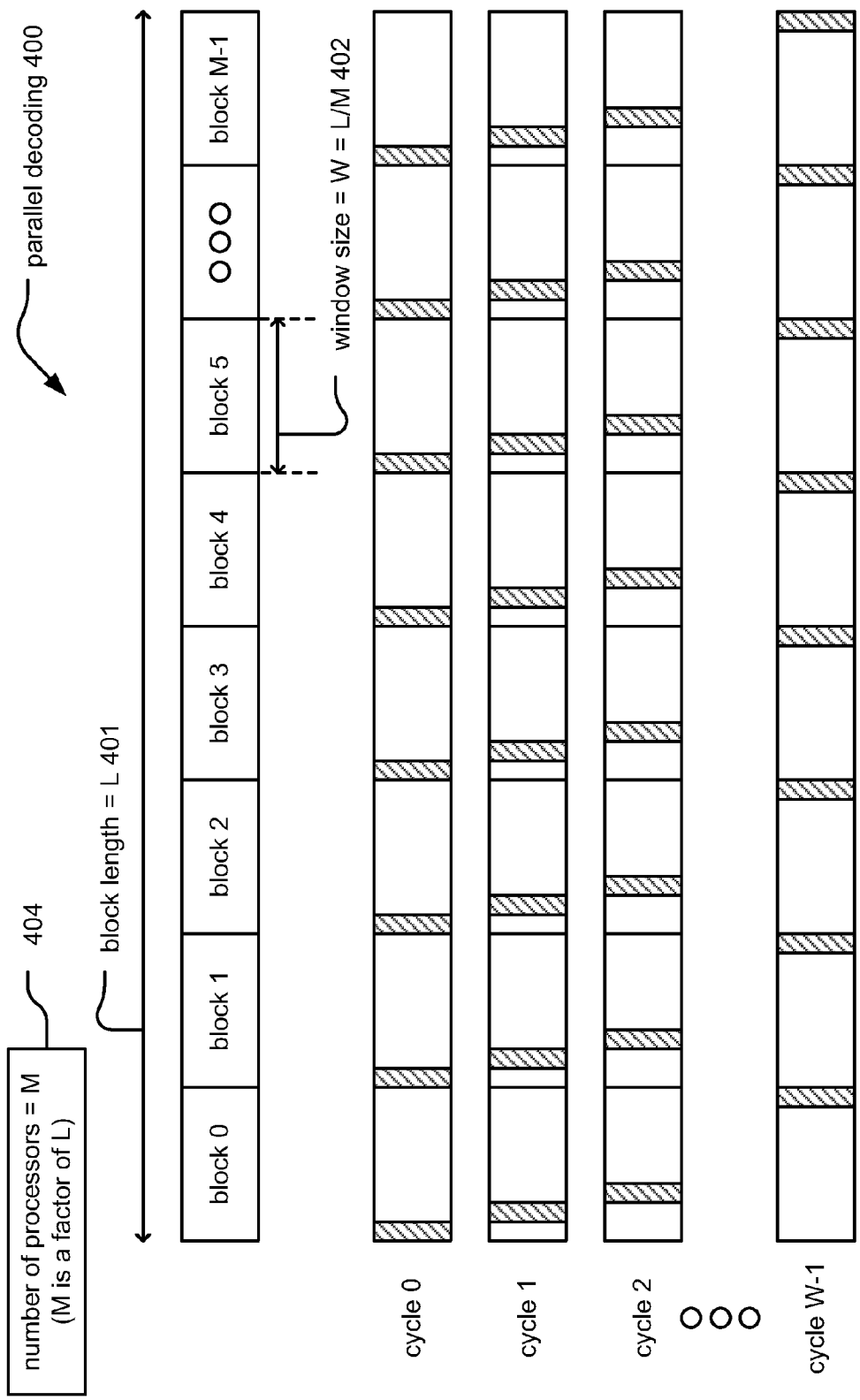
FIG. 4 illustrates an embodiment of a parallel decoding as can be applied within turbo decoding.

FIG. 4 illustrates an embodiment 400 of a parallel decoding as can be applied within turbo decoding. As can be seen, the block length 401 of an information block within the turbo coded signal is shown as L, which may also be referred to as the interleave (π) size. This can also be referred to as an encoded block which will undergo turbo decoding. The block is subdivided into a plurality of windows, such that each window has size W=L/M (e.g., W is the window size), as shown by reference numeral 402. Since turbo code employs a convolutional encoder as its constituent encoder, the consecutive symbols are connected through the states and therefore the sub-block has to contain consecutive information bits.

The number of processors arranged in a parallel decoding implementation is shown as M (as shown by reference numeral 404), and it is noted that M is a factor of L (i.e., M divides L with no remainder).

During a cycle 0 (i.e., a first decoding iteration within the iterative decoding processing of turbo decoding), a first portion of each window is processed, as shown by the corresponding shaded portions of each window. Then, during a cycle 1 (i.e., a second decoding iteration within the iterative decoding processing of turbo decoding), a second portion of each window is processed, as shown by the corresponding shaded portions of each window. This continues on until during a cycle W−1 (i.e., a final decoding iteration within the iterative decoding processing of turbo decoding), a final portion of each window is processed, as shown by the corresponding shaded portions of each window.

During each cycle, a given portion of each window is processed using one decoding processor (e.g., one turbo decoder) in a parallel implementation of a plurality of decoding processor (e.g., a plurality of turbo decoders).

Figure 5:
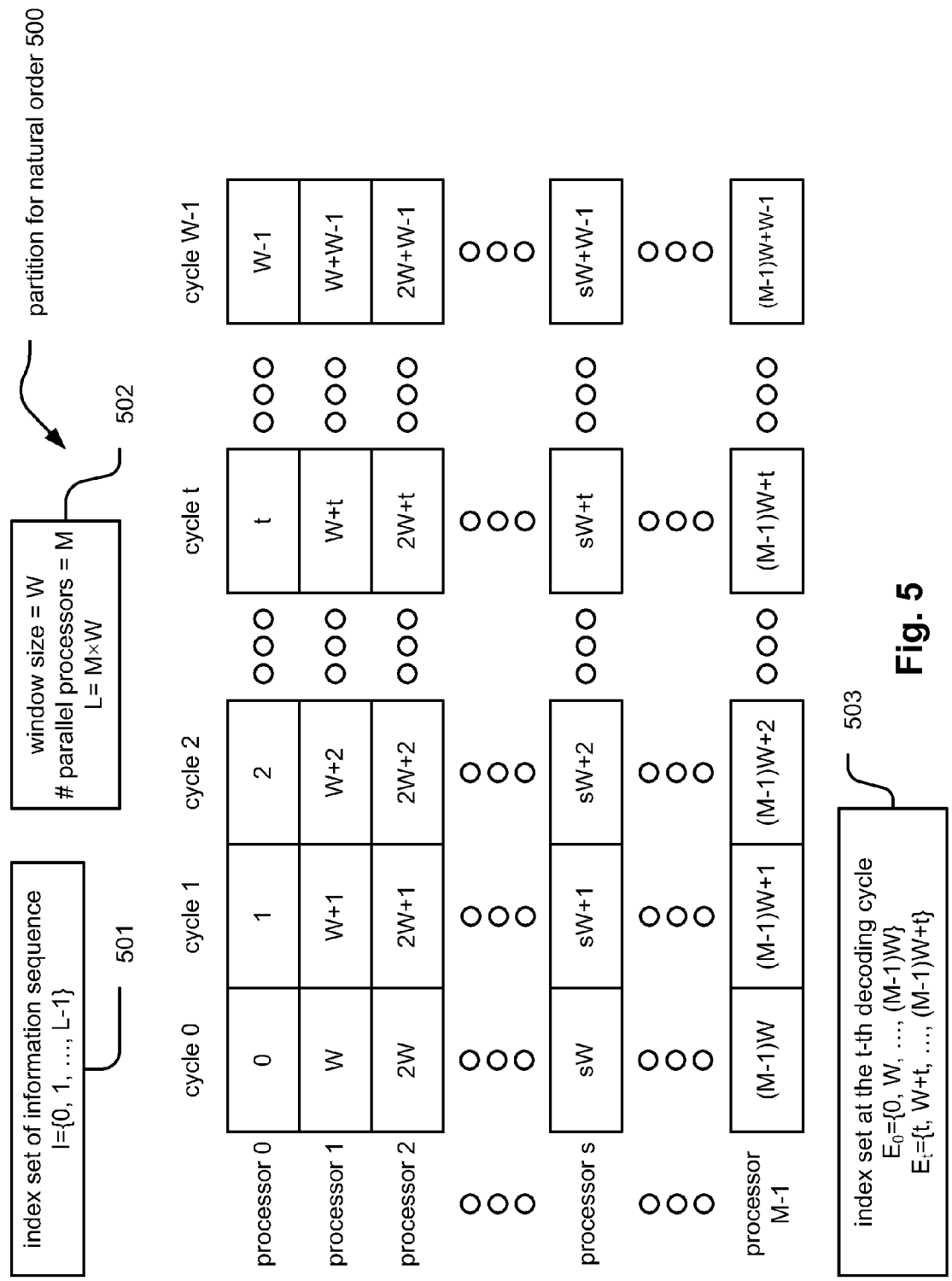
FIG. 5 illustrates an embodiment of a partitioning of decoding processors (as implemented within parallel decoding of turbo coded signals) for natural/non-interleaved order.

FIG. 5 illustrates an embodiment 500 of a partitioning of decoding processors (as implemented within parallel decoding of turbo coded signals) for natural/non-interleaved order. This diagram corresponds to FIG. 4 as well. For example, the window size, W, number of processors, M, and block length, L, conventions are the same as the previous embodiment, as shown by reference numeral 502 (i.e., W=L/M or M·W=L). In addition, the index set of the information sequence is shown as reference numeral 501, I={0,1, . . . ,L−1}, and therefore the index set of the interleaved information sequence is shown as reference numeral 601 in FIG. 6, and it is π(I)=π{(0), π(1), . . . ,π(L−1)}.

Then the index sets of the M windows for I are as follows:

$$\{0,1,\ldots,W-1\},\{W,W+1,\ldots,2W-1\},\ldots,\{(M-1)W,\ldots,MW-1\}. \quad (EQ\ 1)$$

In accordance with the parallel turbo decoding processing which involves employing M decoding processors, in the natural-order phase, during a cycle 0 (i.e., a first decoding iteration within the iterative decoding processing of turbo decoding), the respective first portions of each window that are processed are as follows:

1. processor 0 processes portion 0 of the information block.
2. processor 1 processes portion W of the information block.
3. processor 2 processes portion 2W of the information block.
   . . .
s. processor s processes portion sW of the information block (s is an integer).
   . . .
M−1. processor M−1 processes portion (M−1)W of the information block.

During a cycle 1 (i.e., a second decoding iteration within the iterative decoding processing of turbo decoding), the respective second portions of each window that are processed are as follows:

1. processor 0 processes portion 1 of the information block.
2. processor 1 processes portion W+1 of the information block.
3. processor 2 processes portion 2W+1 of the information block.
   . . .
s. processor s processes portion sW+1 of the information block (s is an integer).
   . . .
M−1. processor M−1 processes portion (M−1)W+1 of the information block.

This process continues on until during a cycle W−1 (i.e., a final decoding iteration within the iterative decoding processing of turbo decoding), the respective second portions of each window that are processed are as follows:

1. processor 0 processes portion W−1 of the information block.
2. processor 1 processes portion W+W−1 of the information block.
3. processor 2 processes portion W+2W−1 of the information block.
   . . .
s. processor s processes portion sW+W−1 of the information block (s is an integer).
   . . .
M−1. processor M−1 processes portion (M−1)W+W−1 of the information block.

The set of the elements in every column at the 0-th and t-th decoding cycles, respectively, are as follows (as also shown by reference numeral 503):

$$E_0 = \{0, W, \ldots, (M-1)W\},$$

and $$E_t = \{t, W+t, \ldots, (M-1)W+t\}.$$

That is to say, this is the "set" of the all i-th elements in all M windows. In fact, at cycle t, the M processors perform decoding in parallel on the bits of the indices in $E_t$.

Figure 6:
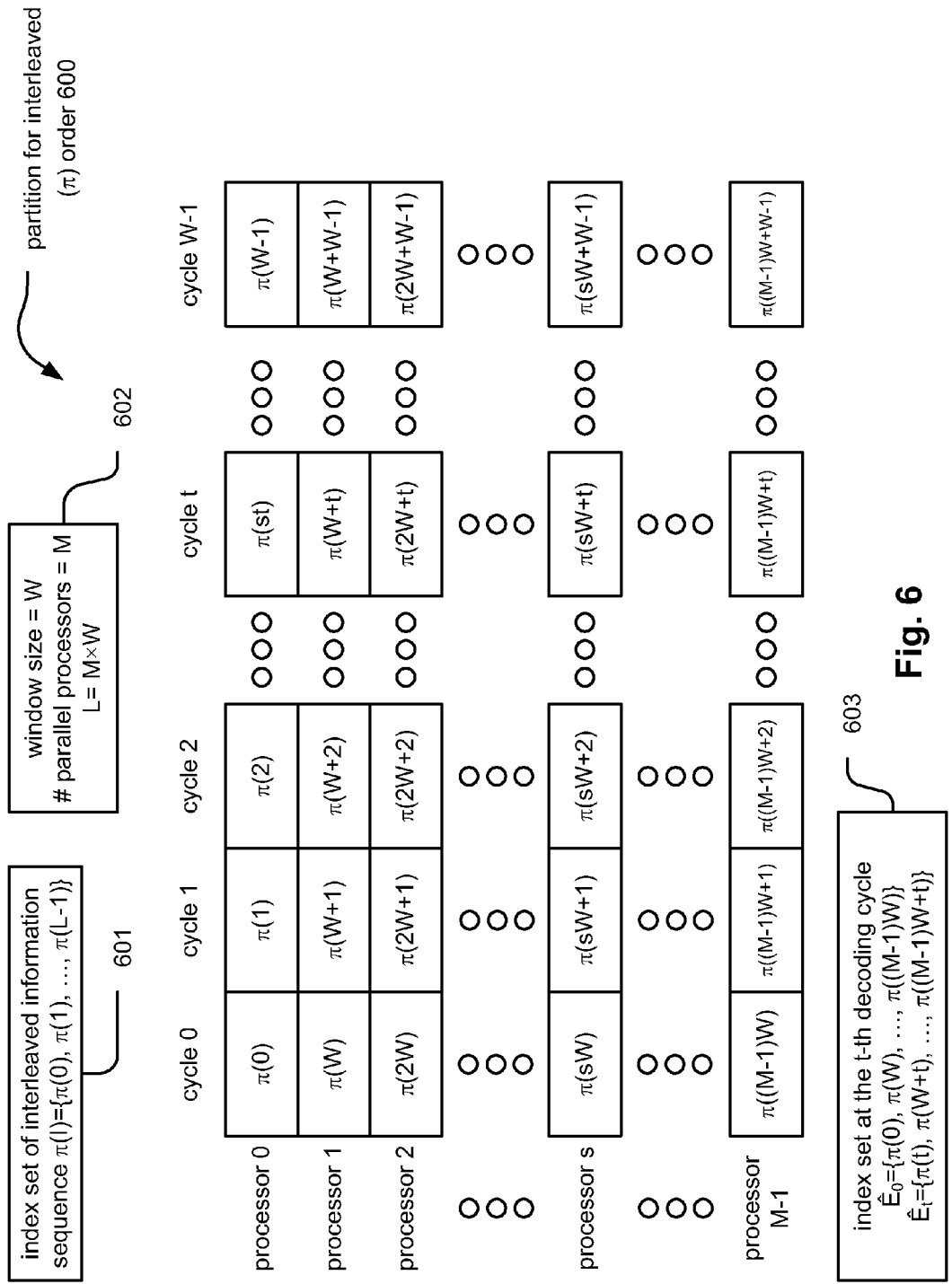
FIG. 6 illustrates an embodiment of a partitioning of decoding processors (as implemented within parallel decoding of turbo coded signals) for interleaved (π) order.

FIG. 6 illustrates an embodiment of a partitioning of decoding processors 600 (as implemented within parallel decoding of turbo coded signals) for interleaved ($\pi$) order. This diagram corresponds to FIG. 4 as well. For example, the window size, W, number of processors, M, and block length, L, conventions are the same as the previous embodiment, as shown by reference numeral 602 (i.e., W=L/M or M·W=L). In addition, the index set of the information sequence is shown as reference numeral 501 as shown in FIG. 5, I={0,1, . . . ,L−1}, and therefore the index set of the interleaved information sequence is shown as reference numeral 601, and it is $\pi(I) = \pi\{(0), \pi(1), \ldots, \pi(L-1)\}$.

In accordance with the parallel turbo decoding processing which involves employing M decoding processors, in the interleaved-order phase, during a cycle 0 (i.e., a first decoding iteration within the iterative decoding processing of turbo decoding), the respective first portions of each window that are processed are as follows (note: these are the interleaved ($\pi$) portions):

1. processor 0 processes portion $\pi(0)$ of the information block.
2. processor 1 processes portion $\pi(W)$ of the information block.
3. processor 2 processes portion $\pi(2W)$ of the information block.
   . . .
s. processor s processes portion $\pi(sW)$ of the information block (s is an integer).
   . . .
M−1. processor M−1 processes portion $\pi((M-1)W)$ of the information block.

During a cycle 1 (i.e., a second decoding iteration within the iterative decoding processing of turbo decoding), the respective second portions of each window that are processed are as follows:

1. processor 0 processes portion $\pi(1)$ of the information block.
2. processor 1 processes portion $\pi(W+1)$ of the information block.
3. processor 2 processes portion $\pi(2W+1)$ of the information block.
   . . .
s. processor s processes portion $\pi(sW+1)$ of the information block (s is an integer).
   . . .
M−1. processor M−1 processes portion $\pi((M-1)W+1)$ of the information block.

This process continues on until during a cycle W−1 (i.e., a final decoding iteration within the iterative decoding processing of turbo decoding), the respective second portions of each window that are processed are as follows:

1. processor 0 processes portion $\pi(W-1)$ of the information block.
2. processor 1 processes portion $\pi(W+W-1)$ of the information block.
3. processor 2 processes portion $\pi(2W+W-1)$ of the information block.
   . . .
s. processor s processes portion $\pi(sW+W-1)$ of the information block (s is an integer).
   . . .
M−1. processor M−1 processes portion $\pi((M-1)W+W-1)$ of the information block.

On the interleave ($\pi$) side, the set of the elements in every column at the 0-th and t-th decoding cycles, respectively, are as follows (as also shown by reference numeral 603):

$$\hat{E}_0 = \{\pi(0), \pi(W), \ldots, \pi((M-1)W)\}, \text{ and}$$

$$\hat{E}_t = \{\pi(t), \pi(W+t), \ldots, \pi((M-1)W+t)\}.$$

Then the index sets of the M windows for $\pi(I)$ are as follows:

$$\{\pi(0), \pi(1), \ldots, \pi(W-1)\}, \{\pi(W), \pi(W+1), \ldots, \pi(2W-1)\}, \ldots, \{\pi((M-1)W), \ldots, \pi(MW-1)\}$$

Generally, the following can be defined for the i-th decoding iteration:

$$\hat{E}_i = \{\pi(i), \pi(W+i), \ldots, \pi(sW+i), \pi((M-1)W+i)\}$$

Then a memory mapping $\mathcal{M}$ is defined from the index set I and $\pi(I)$ to the set $Z_p = \{0, 1, \ldots, P-1\}$ is called a collision-free mapping (as also described in reference [4]) for parallel decoding with parallel degree M if following relationship holds:

$$j, j' \in E_i \Rightarrow \mathcal{M}(j) \neq \mathcal{M}(j'), \text{ and } j, j' \in \hat{E} \Rightarrow \mathcal{M}(j) \neq \mathcal{M}(j') \quad (EQ\ 2)$$

for every $j, j' \in \{0, \ldots, L-1\}$, $j \neq j'$ for all possible i.

It is noted that the decoded values in the index set of the i-th cycle should be mapped to different memory banks (e.g., different memories within a plurality of memories provisioned to service a plurality of parallel arranged turbo decoders).

In reference [4], it is proved that for any given interleave ($\pi$), there always exists a collision-free mapping for parallel decoding of any parallel decoding processor. However, to a communication system which need support channel coding of many different block sizes, the method to generate such a mapping given reference [2] can hardly be implemented.

In reference [5], one formulaic collision-free mapping is defined, which maps $\pi(jW+i)$ to $\lfloor \pi(jW+i)/W \rfloor$ and $\pi^{-1}(jW+i)$ to $\lfloor \pi^{-1}(jW+i)/W \rfloor$, where W is the window size. It is called the contention-free in [4] if an interleave has such a collision-free mapping. Since this mapping employs division, it is referred to as division mapping ($\mathcal{M}_{DIV,W}$). In fact, the mapping can be represented as follows:

$$\mathcal{M}_{DIV,W} : i \mapsto \lfloor i/W \rfloor \quad (EQ\ 3)$$

However, with division mapping the number of parallel processors is limited to be a factor of the interleave ($\pi$) size. For example, take a QPP interleave of size $L = 6144 = 3 \times 2^{11}$. Using the division memory mapping, $\mathcal{M}_{DIV,W}$, then the number of parallel decoding processors M must be a factor of L. Therefore, if the data throughput requires 20 processors (i.e., M=20), then the division memory mapping of $\mathcal{M}_{DIV,W}$ will not work. Herein, a flexible but still formulaic memory mapping ($\mathcal{M}$) is introduced that allows the accommodation of any number of parallel processors M for any quadratic polynomial permutation (QPP) interleave.

However, additional information is presented below to assist in the reader in understanding the subject matter of collision-free memory accessing in the context of parallel implemented turbo decoders. In addition, some additional embodiments of communication devices that can employ parallel implemented turbo decoders are presented.

FIG. 7A illustrates an embodiment of memory mapping on parallel decoding 700 for natural/non-interleaved order phase.

FIG. 7B illustrates an embodiment of memory mapping on parallel decoding 702 for interleaved ($\pi$) order (showing collision in one of the memories).

FIG. 7A and FIG. 7B should be considered in conjunction with one another. Each of these embodiments 700 and 702 employ 4 memory banks (as depicted by memory 741, memory 743, memory 743, and memory 744). An encoded block is shown as being partitioned into a plurality of sub-blocks. This particular encoded block includes 4W data locations.

The first sub-block begins with data location 0, 1, and up to W−1. The second sub-block begins with data location W, W+1, and continues up to 2W−1. The third sub-block begins with data location 2W, 2W+1, and continues up to 3W−1. The fourth sub-block begins with data location 3W, 3W+1, and continues up to 4W−1.

In cycle 0, the first data of the first sub-block (i.e., the data in location 0) is stored in the first location of memory 742.

In cycle 0, the first data of the second sub-block (i.e., the data in location W) is stored in the first location of memory 743.

In cycle 0, the first data of the third sub-block (i.e., the data in location 2W) is stored in the first location of memory 741.

In cycle 0, the first data of the fourth sub-block (i.e., the data in location 3W) is stored in the first location of memory 744.

In cycle 1, the second data of the first sub-block (i.e., the data in location 1) is stored in the second location of memory 741.

In cycle 1, the second data of the second sub-block (i.e., the data in location W+1) is stored in the second location of memory 744.

In cycle 1, the second data of the third sub-block (i.e., the data in location 2W+1) is stored in the second location of memory 742.

In cycle 1, the second data of the fourth sub-block (i.e., the data in location 3W+1) is stored in the second location of memory 743.

This process continues until all data elements of the encoded block have been stored into corresponding memory locations within each of the 4 memory banks. The placement of into which memory bank a particular data element is to be stored depends on the mapping employed.

After undergoing interleaving ($\pi$), the interleaved encoded block also is shown as being partitioned into a plurality of sub-blocks. This particular encoded block includes 4W data locations.

The first sub-block begins with data location $\pi(0)$, $\pi(1)$, and up to $\pi(W-1)$. The second sub-block begins with data location $\pi(W)$, $\pi(W+1)$, and continues up to $\pi(2W-1)$. The third sub-block begins with data location $\pi(2W)$, $\pi(2W+1)$, and continues up to $\pi(3W-1)$. The third sub-block begins with data location $\pi(2W)$, $\pi(2W+1)$, and continues up to $\pi(3W-1)$. The fourth sub-block begins with data location $\pi(3W)$, $\pi(3W+1)$, and continues up to $\pi(4W-1)$.

In cycle 0, the first data of the first sub-block (i.e., the data in location $\pi(0)$) is stored in a location of memory 741 as governed by the particular interleave and mapping employed.

In cycle 0, the first data of the second sub-block (i.e., the data in location $\pi(W)$) is stored in a location of memory 744 as governed by the particular interleave and mapping employed.

In cycle 0, the first data of the third sub-block (i.e., the data in location $\pi(2W)$) is stored in a location of memory 743 as governed by the particular interleave and mapping employed.

In cycle 0, the first data of the fourth sub-block (i.e., the data in location $\pi(3W)$) is stored in a location of memory 742 as governed by the particular interleave and mapping employed.

In cycle 1, the second data of the first sub-block (i.e., the data in location $\pi(1)$) is stored in a location of memory 742 as governed by the particular interleave and mapping employed.

In cycle 1, the second data of the second sub-block (i.e., the data in location $\pi(W+1)$) is stored in a location of memory 741 as governed by the particular interleave and mapping employed.

In cycle 1, the second data of the third sub-block (i.e., the data in location $\pi(2W+1)$) is stored in a location of memory 742 as governed by the particular interleave and mapping employed.

In cycle 1, the second data of the fourth sub-block (i.e., the data in location π(3W+1)) is stored in a location of memory 744 as governed by the particular interleave and mapping employed.

This process continues until all data elements of the elements of the interleaved encoded block have been stored into corresponding memory locations within each of the 4 memory banks. The placement of into which memory bank a particular data element is to be stored depends on the mapping employed.

Note that this mapping is not contention-free since in cycle 1 of the interleaved-order phase, the second data of the first sub-block (i.e., the data in location π(1)) and the second data of the third sub-block (i.e., the data in location π(2W+1)) both map to the same memory 742.

Figure 8:
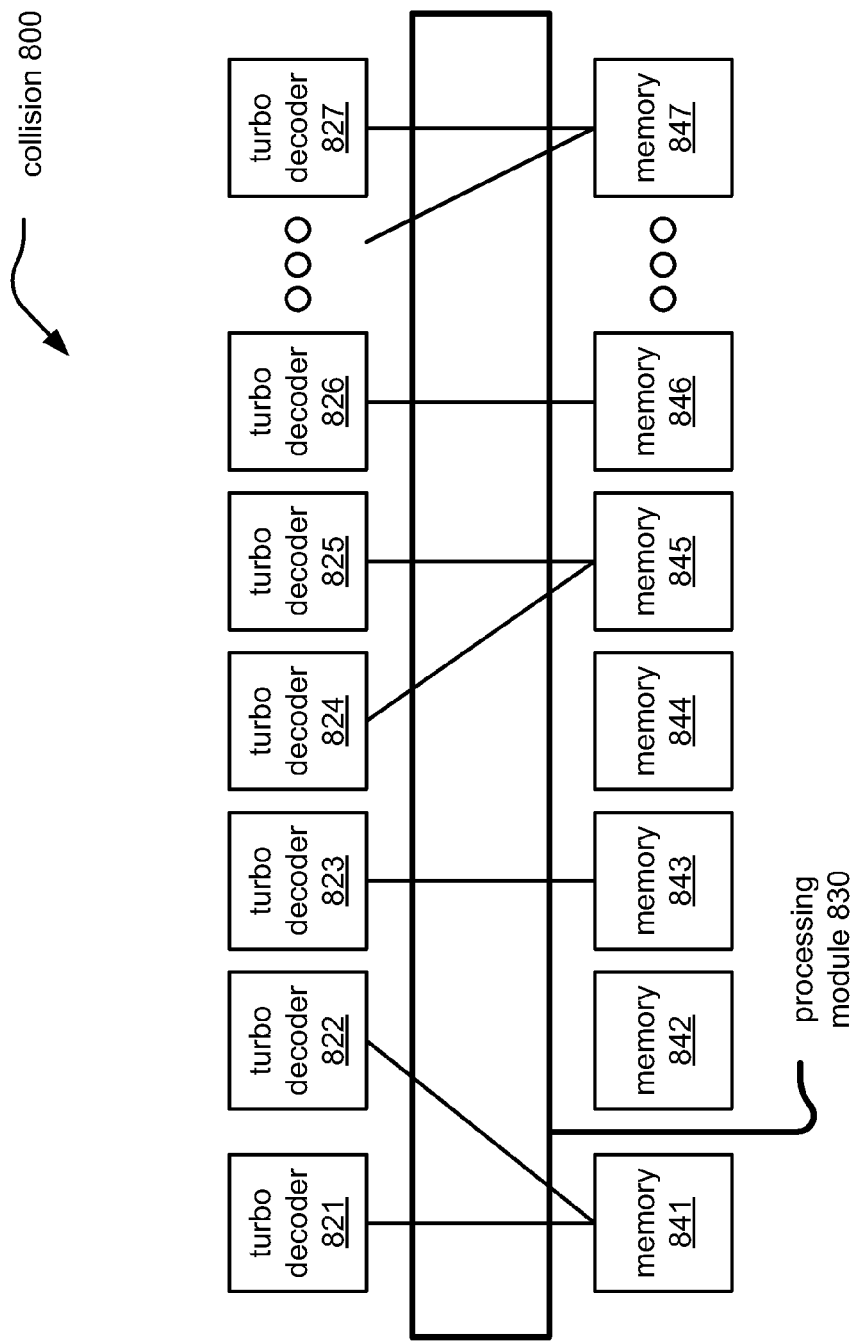
FIG. 8 illustrates an embodiment of a turbo decoder that performs parallel decoding in which collision occurs because of a lack of collision-free memory mapping between turbo decoders and memories.

FIG. 8 illustrates an embodiment of a turbo decoder 800 that performs parallel decoding in which collision occurs because of a lack of collision-free memory mapping between turbo decoders and memories.

This turbo decoder 800 includes a plurality of turbo decoders 821-827, a plurality of memories 841-847, and a processing module 830 that is operable to perform the memory mapping between the plurality of turbo decoders 821-827 and the plurality of memories 841-847. As can be seen, more than one turbo decoders tries to access a same memory at a given time. Specifically, turbo decoder 821 and turbo decoder 822 are trying to access memory 841, and turbo decoder 824 and turbo decoder 825 are trying to access memory 845. Also, turbo decoder 827 and another turbo decoder (included in the region as shown by the ellipsis . . . ) are trying to access memory 847. This creates conflicts and incurs deleterious performance.

Figure 9:
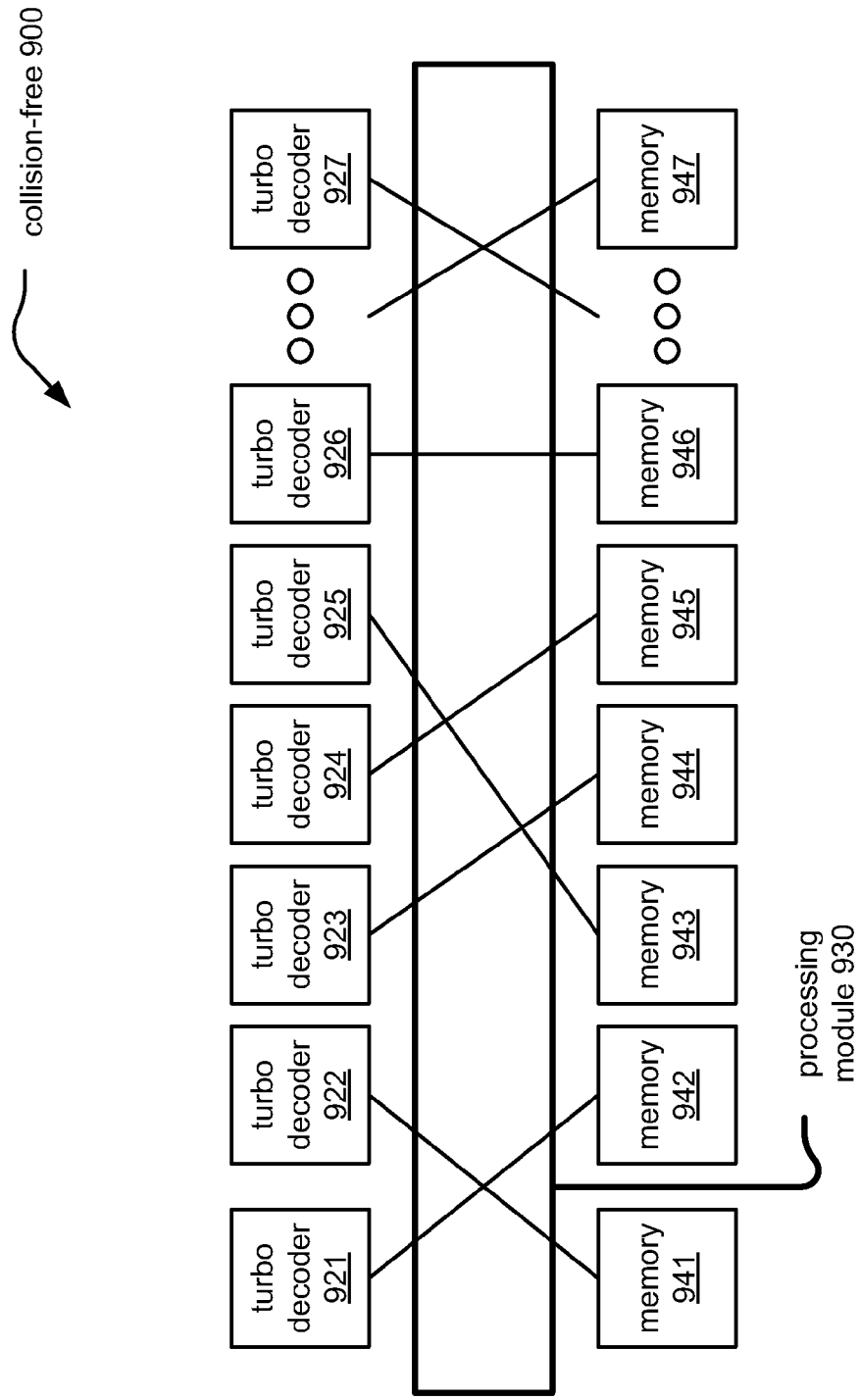
FIG. 9 illustrates an embodiment of a turbo decoder that performs parallel decoding in which no collision occurs because of collision-free memory mapping between turbo decoders and memories.

FIG. 9 illustrates an embodiment of a turbo decoder 900 that performs parallel decoding in which no collision occurs because of collision-free memory mapping between turbo decoders and memories.

This turbo decoder 900 includes a plurality of turbo decoders 921-927, a plurality of memories 941-947, and a processing module 930 that is operable to perform collision-free memory mapping between the plurality of turbo decoders 921-927 and the plurality of memories 941-947. As can be seen, only one turbo decoder accesses any one memory at a given time. This is a truly collision-free memory mapping between the plurality of turbo decoders 921-927 and the plurality of memories 941-947.

Figure 10:
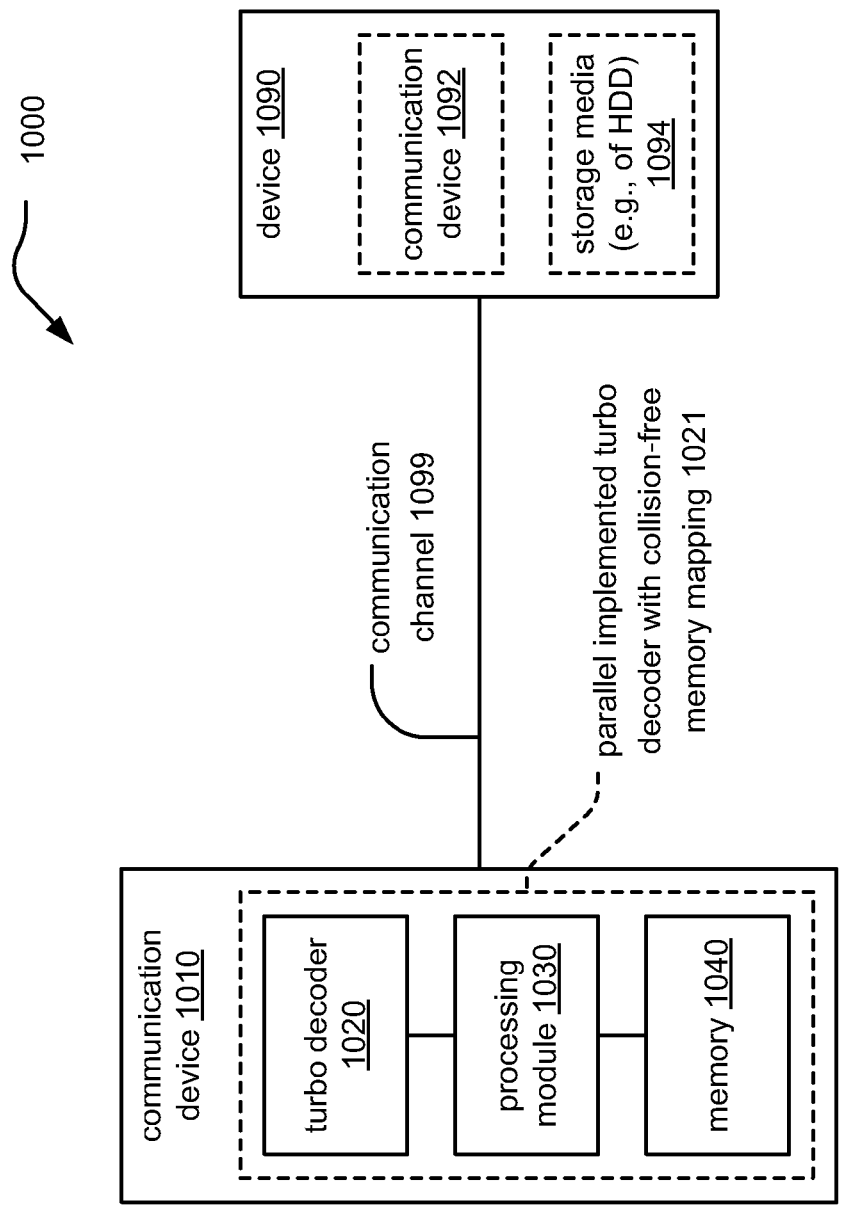
FIG. 10 and FIG. 11 illustrate other embodiments of a communication system.
Figure 11:
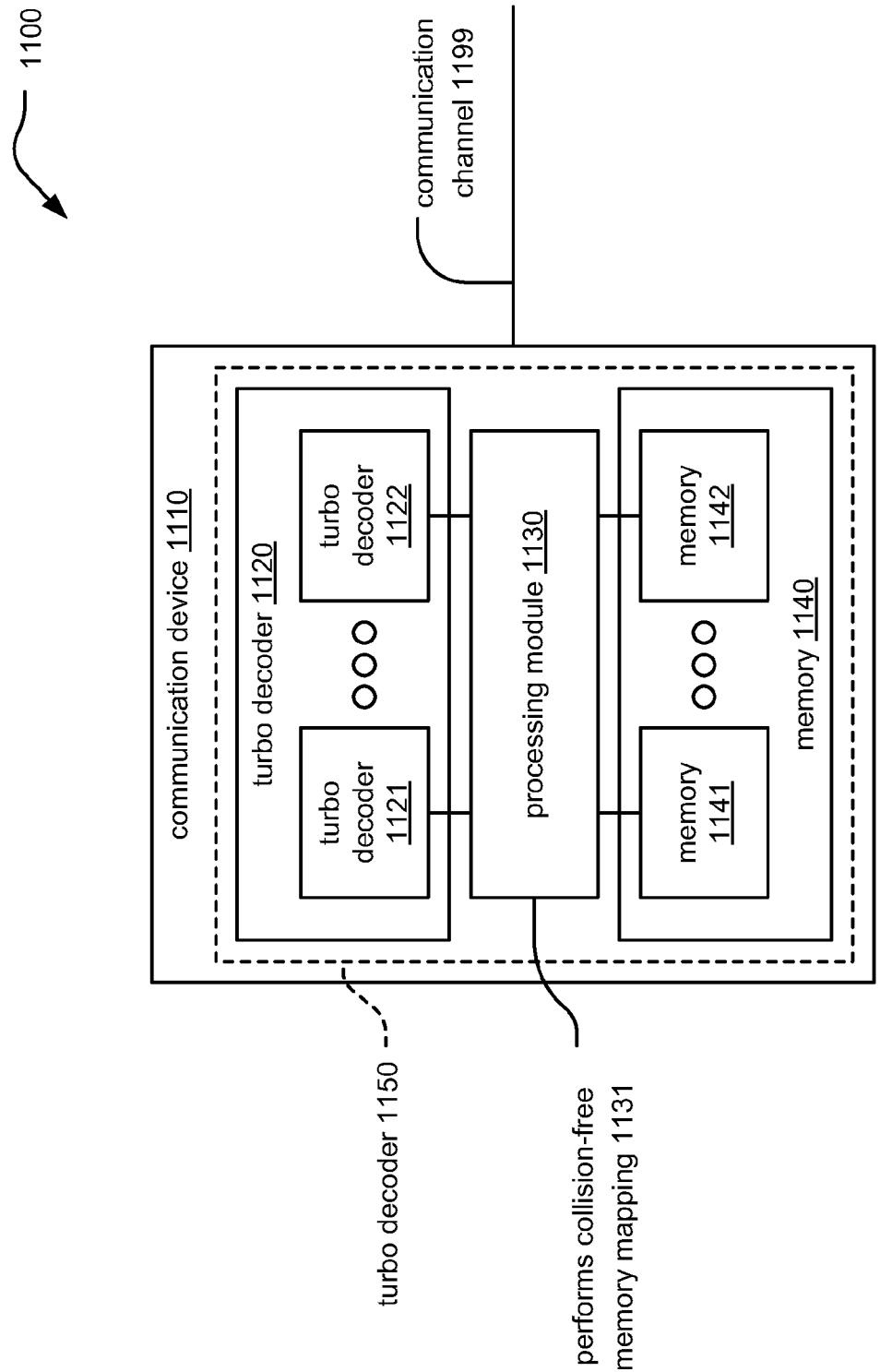

FIG. 10 and FIG. 11 illustrate other embodiments of a communication system.

Referring to the communication system 1000 of FIG. 10, the communication system 1000 includes a communication device 1010 that is coupled to another device 1090 via a communication channel 1099. The communication device 1010 includes a decoder 1021 that is implemented as a parallel implemented turbo decoder that is operable to employ collision-free memory mapping.

The other device 1090 to which the communication device 1010 is coupled via the communication channel 1099 can be another communication device 1092, a storage media 1094 (e.g., such as within the context of a hard disk drive (HDD)), or any other type of device that is capable to receive and/or transmit signals. In some embodiments, the communication channel 1099 is a bi-directional communication channel that is operable to perform transmission of a first signal during a first time and receiving of a second signal during a second time. If desired, full duplex communication may also be employed, in which each of the communication device 1010 and the device 1090 can be transmitted and/or receiving from one another simultaneously.

The decoder 1021 of the communication device 1010 includes a turbo decoder 1020, a processing module 1030, and a memory 1040. The processing module 1030 can be coupled to the memory 1040 so that the memory is operable to store operational instructions that enable to the processing module 1030 to perform certain functions.

Generally speaking, the processing module 1030 is operable to perform collision-free memory mapping between the turbo decoder 1020 and the memory 1040 during iterative decoding processing.

It is also noted that the processing module 1030, as well as any other processing module described herein, can be implemented in any number of ways as described below. In one embodiment, the processing module 1030 can be implemented strictly as circuitry. Alternatively, the processing module 1030 can be implemented strictly in software such as can be employed within a digital signal processor (DSP) or similar type device. In even another embodiment, the processing module 1030 can be implemented as a combination of hardware and software as well without departing from the scope and spirit of the invention.

In even other embodiments, the processing module 1030 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The processing module 1030 can be coupled to the memory 1040 that is operable to store operational instructions that enable to processing module 1030 to perform the appropriate collision-free memory mapping between the turbo decoder 1020 and the memory 1040.

Such a memory 1040 may be a single memory device or a plurality of memory devices. Such a memory 1040 may be a read-only memory, random access memory, volatile memory, non-volatile memory, static memory, dynamic memory, flash memory, and/or any device that stores digital information. Note that when the processing module 1030 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

Referring to the communication system 1100 of FIG. 11, this embodiment is somewhat analogous to the previous embodiment. The communication system 1100 includes a communication device 1110 that can be coupled to another device via a communication channel 1199. The communication device 1110 includes a turbo decoder 1120 that is itself composed of a plurality of turbo decoders 1121-1122. The communication device 1110 also includes a memory 1140 that is itself composed of a plurality of memories 1141-1142. A processing module 1130 is operable to perform collision-free memory mapping between the plurality of turbo decoders 1121-1122 and the plurality of memories 1141-1142 during iterative decoding processing of a turbo coded signal.

FIG. 12A, FIG. 12B, FIG. 12C, and FIG. 12D illustrates various, successive collision-free memory mappings between turbo decoders and memories. These 4 diagrams should be considered in conjunction with one another.

A communication device includes a turbo decoder that is itself composed of a plurality of turbo decoders 1221, 1222, and 1223. Such a communication device also includes a memory that is itself composed of a plurality of memories

1241, 1242, and 1243. A processing module 1230 is operable to perform collision-free memory mapping between the plurality of turbo decoders 1221, 1222, and 1223 and the plurality of memories 1241, 1242, and 1243 during iterative decoding processing of a turbo coded signal.

At any given time, the processing module 1230 is operable to ensure that only one turbo decoder accesses a given memory at a given time. For example, a processing module 1230 is operable to perform a first collision-free memory mapping at a time 1, as shown by reference numeral 1201. The processing module 1230 is operable to perform a second collision-free memory mapping at a time 2, as shown by reference numeral 1202. The processing module 1230 is operable to perform a third collision-free memory mapping at a time 3, as shown by reference numeral 1203. The processing module 1230 is operable to perform a fourth collision-free memory mapping at a time 4, as shown by reference numeral 1204. As can be seen, only one turbo decoder is connected to any one memory at any given time in each of these 4 diagrams.

As can be seen, the collision-free memory mapping between the turbo decoders 1221, 1222, and 1223 and the plurality of memories 1241, 1242, and 1243 changes as a function of time during iterative decoding processing of a turbo coded signal.

Quadratic Polynomial Permutation (QPP)

Additional details regarding the quadratic polynomial permutation (QPP) interleave ($\pi$) are presented below.

Let a block size, or an interleave size be L, then if the following function $$\pi(x) = ax + bx^2 \mod(L) \qquad \text{(EQ 4)}$$

is a permutation on $\{0, 1, \ldots, L-1\}$, then it is referred to as a quadratic polynomial as described in reference [3].

It is also shown in reference [3] that if the number of processors M is a divisor of L, and $W = L/M$, then using the division memory mapping, $\mathcal{M}_{DIV,W}$, of (EQ 3) is collision-free for QPP interleave ($\pi$).

Formulaic and Flexible Collision-Free Memory Mapping ($\mathcal{M}$)

Above, with the division memory mapping, $\mathcal{M}_{DIV,W}$, the number of parallel implemented decoding processors is limited to be a factor of the interleave size. In other words, the division memory mapping, $\mathcal{M}_{DIV,W}$, cannot accommodate any possible number of parallel implemented decoding processor.

For example, take a QPP interleave of size $L = 6144 = 3 \times 2^{11}$. Using division memory mapping, $\mathcal{M}_{DIV,W}$, then the number of parallel implemented decoding processors P must be a factor of the block length/interleave size, L. Therefore, considering one possible example, if the data throughput requires P=20, then division memory mapping, $\mathcal{M}_{DIV,W}$, will not work.

In this following, a novel approach to memory mapping ($\mathcal{M}$) is presented that is flexible (e.g., can accommodate any number of decoding processors P), and yet is still a formulaic memory mapping ($\mathcal{M}$).

Consider an interleave Z of size L. Let C be a number such that the following condition holds:

Condition I:

$$\text{if } \pi(x) = \pi(y) \mod C \text{ then } x = y \mod C \qquad \text{(EQ 5)}$$

Given any number of parallel processors P such that $P \leq C$. Let a window size W be a smallest number satisfying the following condition:

Condition II:

$$\text{a) } W \geq L/P \text{ and b) } \gcd(W, C) = 1. \qquad \text{(EQ 6)}$$

Let $L' = P*W$.

A parallel implementation of turbo decoding can now be considered to be performed on a "virtual" interleave of size $L'$ (e.g., a "virtual" block of size $L'$ as well).

Referring back to FIG. 5 and FIG. 6, it can be observed that some decoding cycle with either $sW+t>L$ or $\pi(sW+t)>L$ becomes a dummy decoding cycle, i.e. the corresponding processor in that cycle does nothing.

A modulation memory mapping, $\mathcal{M}_{MOD,C,W}$, with window size W can be defined as follows:

$$\mathcal{M}_{MOD,C,W} : i \mapsto i \mod C$$

The value and condition of C is defined below in Theorem 1.

Theorem 1 Let the number of parallel decoding processors P be any number that satisfies $P \leq C$, where C satisfies Condition I in (EQ 5) above, and the window size W satisfies Condition II in (EQ 6) above, then modulation memory mapping, $\mathcal{M}_{MOD,C,W}$, is a collision-free memory accessing mapping for $\pi$.

Proof:

A) in the natural order phase of turbo decoding, if $$\mathcal{M}_{MOD,C,W}(s_0 W+t) = \mathcal{M}_{MOD,C,W}(s_1 W+t), \text{ then}$$
$$s_0 W \equiv s_1 W \mod C.$$

But $s_0$ and $s_1$ are less than $P \leq C$ (see, EQ 1) and $\gcd(W, C) = 1$ (Condition, EQ 6). Therefore, the following relationship holds:

$$\mathcal{M}_{MOD,C,W}(s_0 W+t) = \mathcal{M}_{MOD,C,W}(s_1 W+t) \Rightarrow s_0 = s_1.$$

B) in the interleaved ($\pi$) order phase of turbo decoding, if $$\mathcal{M}_{MOD,C,W}(\pi(s_0 W+t)) = \mathcal{M}_{MOD,C,W}(\pi(s_1 W+t)), \text{ then}$$

$$\pi(s_0 W+t) \equiv \pi(s_1 W+t) \mod C.$$

By the condition of (EQ 5), it implies that $\pi(s_0 W+t) \equiv \pi(s_1 W+t) \mod C$. So, once again, $s_0 = s_1$.

By combining A) and B), it can be proven that we prove that modulation memory mapping, $\mathcal{M}_{MOD,C,W}$, is a collision-free memory accessing mapping for $\pi$.

When the interleave ($\pi$) is quadratic polynomial permutation (QPP), we have the following proposition.

Proposition 1 Consider a QPP $\pi(x) = ax + bx^2 \mod L$ with size L. If an integer C satisfies C|b (i.e., b is a divisor if C) and $\gcd(a, C) = 1$, then $$\pi(x) = \pi(y) \mod C \Rightarrow x = y \mod C.$$

Proof: $\pi(x) = \pi(x) = \pi(y) \mod C \Rightarrow a(x-y) + b(x^2 - y^2) = 0 \mod C$. Thus $$a(x-y) \mod C = 0.$$

This implies that $x = y \mod C$.

Some examples are provided below that employ the QPP interleave ($\pi$) in the context of parallel implemented turbo decoder, and as can be seen, a formulaic flexible collision-free memory mapping ($\mathcal{M}$) is provided for accessing the memory banks implemented within a parallel turbo decoding architecture with quadratic polynomial permutation (QPP) interleave.

EXAMPLE 1

Take QPP $\pi$ of size $L = 6144 = 3 \times 2^{11}$ in the list of reference [5] where $a = 263$, $b = 480 = 2^5 \times 3 \times 5$. Take $P = C = 20 = 5 \times 4$. We have $\gcd(a, C) = 1$ and C|b (i.e., C satisfies the conditions in Proposition 1). Thus $\pi(x) = \pi(y) \mod C \Rightarrow x = y \mod C$.

Let W=309, then W satisfies the condition in (EQ 6), i.e.
a) W≧L|P, and
b) gcd(W,C)=1.
Then, by Theorem 1, a modulation memory mapping, $\mathcal{M}_{MOD\ 20,309}$, is a collision-free memory mapping for this QPP with a total number of parallel implemented turbo decoding processors of 20 (i.e., P=20).

By taking P=19<C=20, we have modulation memory mapping, $\mathcal{M}_{MOD\ 20,324}$, that is a collision-free mapping for this QPP with a total number of parallel implemented turbo decoding processors of 19 (i.e., P=19).

In the following a more general case that satisfying Condition I is given.

Theorem 2 Let $\pi(x)=ax+bx^2$ mod L be QPP interleave of size L.

If C is a factor of L, i.e., C|L. Then $\pi(x)=\pi(y)$ mod C if and only if x=y mod C (i.e., Condition I is satisfied).

Proof. (←) Suppose x=y mod C.
There is an integer k such that x=y+kC. Thus $\pi(y)-\pi(x)=a(x+kC-x)+b(x^2+2kCx+4k^2C^2-x^2)$mod $L=C(ak+2b^2kx+4k^2C)$mod $L=0$ mod $C$ since C|L.
(→) Suppose $\pi(x)=\pi(y)$mod C.
Define two sets
Set 1: S(x)={i|i=x mod C}, and
Set 2: S(y)={j|j=y mod C}.
Assume x≠y mod C, then S(x)∩S(y)=φ.
However, by (←) we have $\pi(S(x))=\{\pi(i)|i=x \text{ mod } C\}=\{\pi(i)|\pi(i)=\pi(x)\text{mod } C\}$,
and $\pi(S(y))=\{\pi(j)|j=y \text{ mod } C\}=\{\pi(j)|\pi(j)=\pi(y)\text{mod } C\}$.

Thus $\pi(S(x))=\pi(S(y))$.
This contradicts to S(x)∩S(y)=φ and π is a permutation.
Therefore, x=y mod C.

EXAMPLE 2

Take QPP π of size $L=6144=3\times2^{11}$ in the list of reference [5]. Let the number of parallel implemented turbo decoding processors be 20 (i.e., P=20). Take C=24. Then C|L and P<C. Then by Theorem 2, Condition I holds.
Let W=311, then W satisfies Condition II in (EQ 6), i.e.,
a) W≧L|P, and
b) gcd(W,C)=1.
Then, by Theorem 1, the modulation memory mapping, $\mathcal{M}_{MOD\ 20,311}$, is a collision-free memory mapping for this QPP interleave (π) with a total number of parallel implemented turbo decoding processors of 20 (i.e., P=20).

EXAMPLE 3

Take QPP π of size $L=4736=37* 2^7$ in the list of reference [5]. Let the number of parallel implemented turbo decoding processors be 10 (i.e., P=10). Take C=16. Then C|L and P<C. Then by Theorem 2, Condition I holds.
Let W=475, then W satisfies Condition II in (EQ 6), i.e.
a) W≧L|P, and
b) gcd(W,C)=1.
Then, by Theorem 1, modulation memory mapping, $\mathcal{M}_{MOD\ 10,475}$, is a collision-free mapping for this QPP with QPP interleave (π) with a total number of parallel implemented turbo decoding processors of 10 (i.e., P=10).

In general, for any number of parallel implemented turbo decoding processors, P, by carefully choosing the number C≧P and W, the modulation memory mapping, $\mathcal{M}_{MOD,C,W}$, is a collision-free memory mapping for any QPP interleave (π) given in Table 3 of reference [5].

Moreover, the modulation memory mapping, $\mathcal{M}_{MOD,C,W}$, provides more freedom for selecting the particular quadratic polynomial permutation (QPP) interleave (π) that satisfies a parallel turbo decoding implementation with any desired number of parallel implemented turbo decoding processors.

Figure 13:
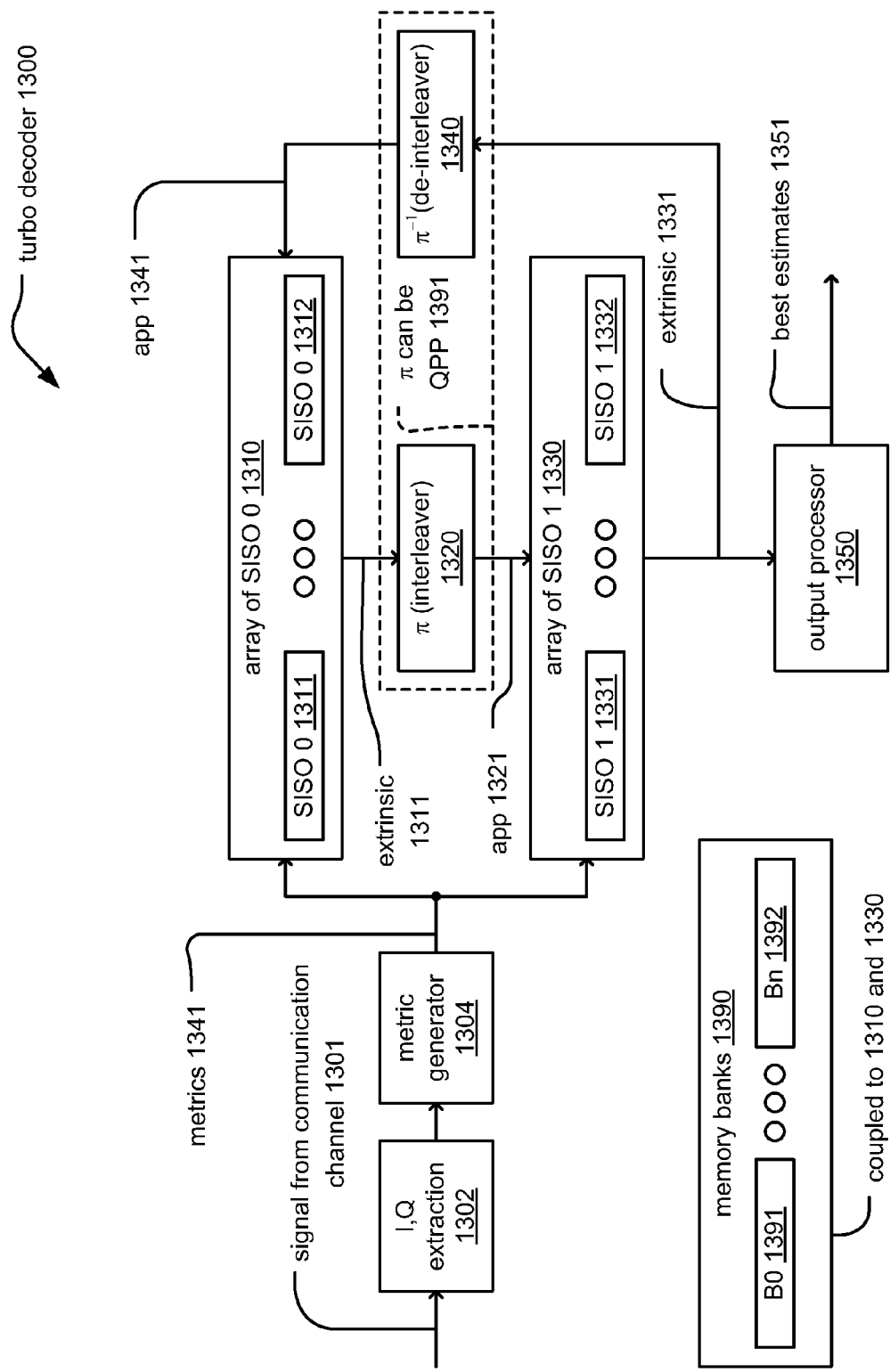
FIG. 13 illustrates an embodiment of a turbo decoder that employs two separate pluralities of SISO decoders for accessing data stored within a plurality of memory banks.

FIG. 13 illustrates an embodiment of a turbo decoder 1300 that employs two separate pluralities of SISO decoders (1310 and 1330) for accessing data stored within a plurality of memory banks 1390. As shown within other embodiments, a received signal (e.g., typically received from a communication channel) is provided to an I,Q extraction module 1302 that extracts the I,Q (in-phase and quadrature) components from the received signal 1301. This may be viewed as being receiver pre-processing, and it can include any appropriate frequency conversion (typically down-conversion from a carrier frequency, if needed). The I,Q can then be mapped according to the modulation's appropriate constellation and mapping. Then, the mapped I,Q is passed to a metric generator 1304. The metric generator 1304 generates the appropriate metrics 1341 that are measured from the received I,Q to the constellation points within the modulation's appropriate constellation and mapping; the metrics are indexed by the mapping of the constellation points within the modulation; these metrics may be viewed as being the scaled Euclidian distances from the location of the actual received symbol to the expected constellation point locations within the modulation.

Continuing on with the turbo decoding process and functionality, the metrics 1341 that are calculated by the metric generator 1304 are then provided simultaneously provided for use by a first array of soft-in/soft-out (SISO) 0 decoders 1310 and a first array of SISO 1 decoders 1330. This first array of SISO 0 decoders 1310 includes a number of SISO 0 decoders, as shown by as shown by SISO 0 1311, . . . , and SISO 0 1312. Each individual SISO decoder in the array of SISO 0 decoders 1310 is operable to perform SISO decoding of data stored within a particular memory location within one of the particular memory banks 1390.

The earlier calculated metrics 1341 that are calculated by the metric generator 1304 are also provided to the second array of SISO 1 decoders 1330. This array of SISO 1 decoders 1330 includes a number of SISO 1 decoders, as shown by as shown by SISO 1 1331, . . . , and SISO 1 1332. Each individual SISO decoder in the array of SISO 1 decoders 1330 is also operable to perform SISO decoding of data stored within a particular memory location within one of the particular memory banks 1390.

In the context of trellis coding (e.g., turbo trellis coded modulation (TTCM)), each of the first array of SISO 0 decoder 1310 and the second array of SISO 1 decoders 1330 calculates forward metrics (alphas) and backward metrics (betas), and extrinsic values according to the trellis employed for each of the individual data entries within each of the corresponding memory locations that are being updated in that particular decoding iterations.

These alphas, betas, and extrinsics are all calculated for each symbol within a frame that is to be decoded. These calculations of alphas, betas, and extrinsics are all based on the trellis.

Starting with the first array of SISO 0 decoders 1310, after the extrinsic values 1311 have been calculated, they are passed to an interleaver (π) 1320 after which it is passed to the second array of SISO 1 decoders 1330 as "a priori probability" (app) information 1321. It is noted that the accessing of the data within the memory banks 1390 is performed in a collision-free manner because of the memory mapping employed therein which is in accordance with the modulation memory mapping, $\mathcal{M}_{MOD,C,W}$, which provides more freedom for selecting a particular quadratic polynomial permutation (QPP) interleave (π) that satisfies a parallel turbo decoding implementation with any desired number of parallel implemented turbo decoding processors.

Similarly, after extrinsic values 1331 have been calculated within the second array SISO 1 decoders 1330, they are passed to a de-interleaver ($\pi^{-1}$) 1340 after which it is passed as "a priori probability" (app) information 1341 back to the first array SISO 0 decoders 1310.

It is noted that a single decoding iteration, within the iterative decoding process of the turbo decoder 1300 consists of performing two SISO operations; that is to say, the iterative decoding process must pass through both the first array of SISO 0 decoders 1310 and through the second array of SISO 1 decoders 1330.

After a significant level of confidence has been achieved and a solution is being converged upon, or after a predetermined number of decoding iterations has been performed, then the output from the second array of SISO 1 decoders 1330 is passed as output to an output processor 1350. The operation of the array of SISO 0 decoders 1310 and the array of SISO 1 decoders 1330 may generally be referred to as calculating soft symbol decisions of the symbols contained within the received signal 1301. These soft symbol decisions may be performed on a true bit level in certain embodiments. The output processor 1350 uses these soft symbol decisions to generate best estimates 1351 (e.g., hard bit and/or symbol decisions) for the information bits that have been encoded within the original turbo coded signal (e.g., generally within a turbo encoder location at another end of a communication channel into which the signal 1301 was originally launched.

It is also noted that each of the interleaving performed within the interleaver (π) 1320 can be performed using an embodiment of a QPP interleave, as shown by reference numeral 1391. Also, there are embodiments in which the de-interleaving performed within the de-interleaver ($\pi^{-1}$) 1340 can also be performed using an embodiment of a QPP de-interleave.

Figure 14:
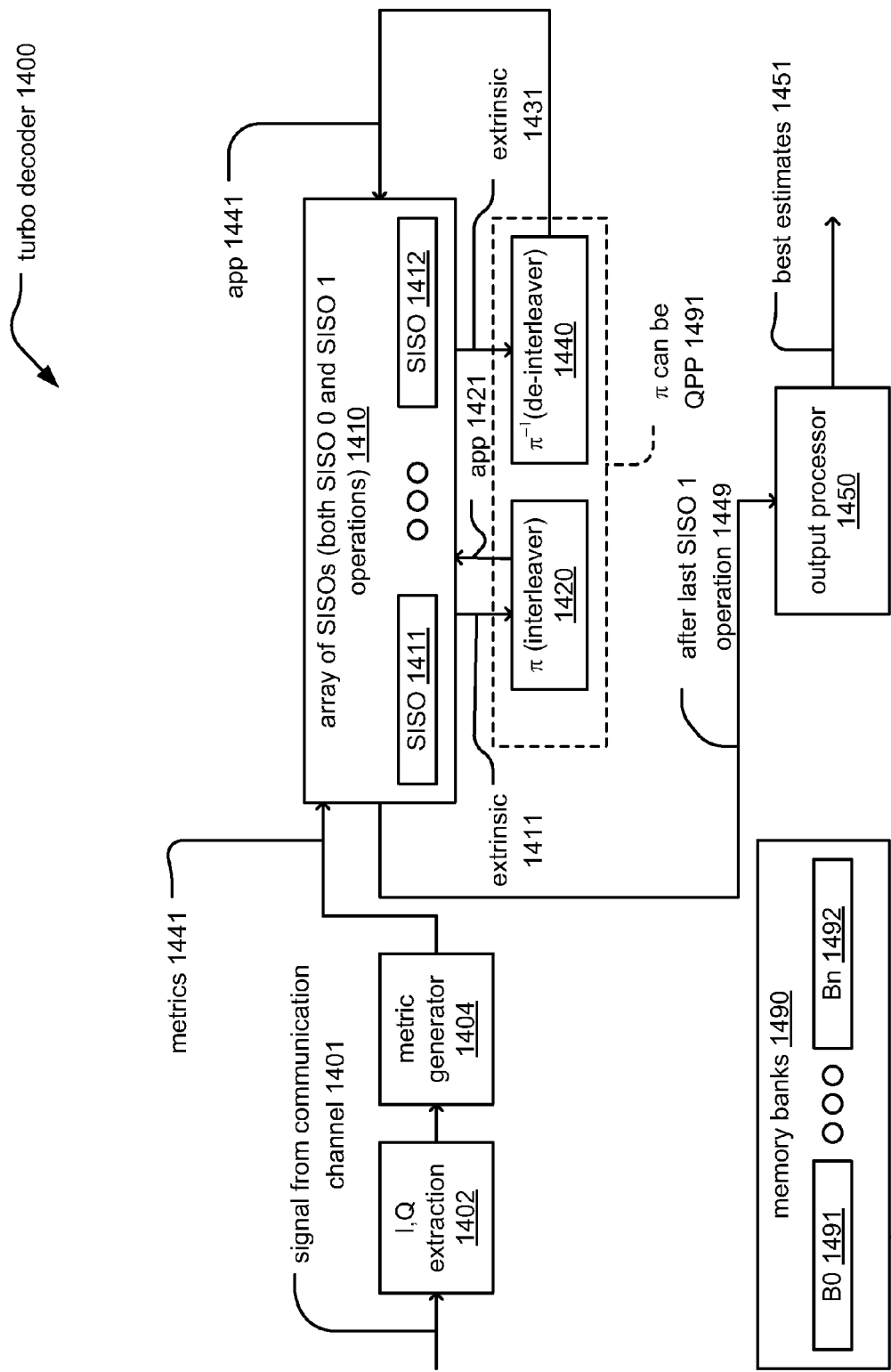
FIG. 14 illustrates an embodiment of a turbo decoder that employs a plurality of SISO decoders for accessing data stored within a plurality of memory banks.

FIG. 14 illustrates an embodiment of a turbo decoder 1400 that employs a plurality of SISO decoders for accessing data stored within a plurality of memory banks. As shown within other embodiments, a received signal (e.g., typically received from a communication channel) is provided to an I,Q extraction module 1402 that extracts the I,Q (in-phase and quadrature) components from the received signal 1401. This may be viewed as being receiver pre-processing, and it can include any appropriate frequency conversion (typically down-conversion from a carrier frequency, if needed). The I,Q can then be mapped according to the modulation's appropriate constellation and mapping. Then, the mapped I,Q is passed to a metric generator 1404. The metric generator 1404 generates the appropriate metrics 1441 that are measured from the received I,Q to the constellation points within the modulation's appropriate constellation and mapping; the metrics are indexed by the mapping of the constellation points within the modulation; these metrics may be viewed as being the scaled Euclidian distances from the location of the actual received symbol to the expected constellation point locations within the modulation.

Continuing on with the turbo decoding process and functionality, the metrics 1441 that are calculated by the metric generator 1404 are then provided for use by an array of soft-in/soft-out (SISO) decoders 1410 that is operable to perform both the SISO 0 and the SISO 1 decoding operations. This array of SISO decoders 1410 includes a number of SISO decoders, as shown by as shown by SISO 1411, ..., and SISO 1412. Each individual SISO decoder in the array of SISO decoders 1410 is operable to perform SISO decoding of data stored within a particular memory location within one of the particular memory banks 1490 (for both the SISO 0 and SISO 1 decoding operations).

In the context of trellis coding (e.g., turbo trellis coded modulation (TTCM)), each SISO decoder of the array of SISO decoder 1410 calculates forward metrics (alphas) and backward metrics (betas), and extrinsic values according to the trellis employed for each of the individual data entries within each of the corresponding memory locations that are being updated in that particular decoding iterations.

These alphas, betas, and extrinsics are all calculated for each symbol within a frame that is to be decoded. These calculations of alphas, betas, and extrinsics are all based on the trellis.

Starting with the first decoding operation (i.e., SISO 0) as performed by the array of SISO decoders 1410, after the extrinsic values 1411 have been calculated, they are passed to an interleaver (π) 1420 after which it is passed to back to the array of SISO decoders 1410 as "a priori probability" (app) information 1421. It is noted that the accessing of the data within the memory banks 1490 by the array of SISO decoders 1410, when performing the SISO 1 decoding operations, is performed in a collision-free manner because of the memory mapping employed therein which is in accordance with the modulation memory mapping, $\mathcal{M}_{MOD,C,W}$, which provides more freedom for selecting a particular quadratic polynomial permutation (QPP) interleave (π) that satisfies a parallel turbo decoding implementation with any desired number of parallel implemented turbo decoding processors.

Similarly, after extrinsic values 1431 have been calculated within the SISO decoders 1410 (i.e., during the SISO 1 decoding operations), they are passed to a de-interleaver ($\pi^{-1}$) 1440 after which it is passed as "a priori probability" (app) information 1441 back to the SISO decoders 1410.

It is noted that a single decoding iteration, within the iterative decoding process of the turbo decoder 1400 consists of performing two SISO operations; that is to say, the iterative decoding process must pass through the array of SISO decoders 1410 twice.

After a significant level of confidence has been achieved and a solution is being converged upon, or after a predetermined number of decoding iterations have been performed, then the output from the array of SISO decoders 1410 (after having performed the SISO 1 decoding operations) is passed as output to an output processor 1450. The operation of the array of SISO decoders 1410 may generally be referred to as calculating soft symbol decisions of the symbol contained within the received symbol. These soft symbol decisions may be performed on a true bit level in certain embodiments. The output processor 1450 uses these soft symbol decisions to generate best estimates 1451 (e.g., hard bit and/or symbol decisions) for the information bits that have been encoded within the original turbo coded signal (e.g., generally within a turbo encoder location at another end of a communication channel into which the signal 1401 was originally launched.

It is also noted that each of the interleaving performed within the interleaver (π) 1420 can be performed using an embodiment of a QPP interleave, as shown by reference numeral 1491. Also, there are embodiments in which the de-interleaving performed within the de-interleaver ($\pi^{-1}$) 1440 can also be performed using an embodiment of a QPP de-interleave.

As shown within this embodiment, a single array of SISO decoders 1410 is operable to perform both the SISO 0 and the SISO 1 decoding operations. Also, it sis noted that a single module can be employed to perform both the functionality of the interleaver ($\pi$) 1420 and the de-interleaver ($\pi^{-1}$) 1440, and both of these can be based on a QPP format.

Figure 15:
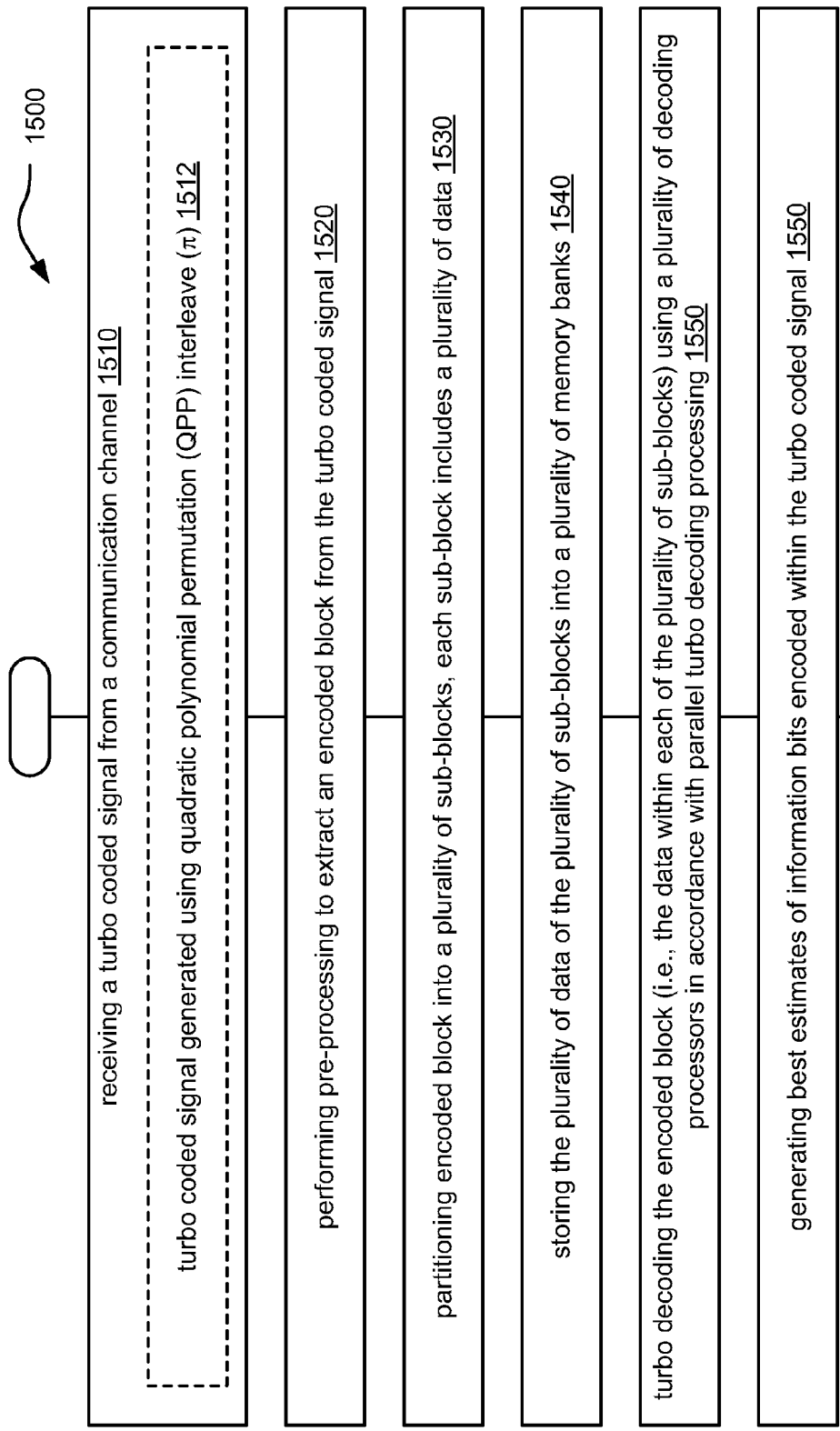
FIG. 15 illustrates an embodiment of a method for decoding a turbo coded signal.

FIG. 15 illustrates an embodiment of a method 1500 for decoding a turbo coded signal. As shown in a block 1510, the method 1500 begins by receiving a turbo coded signal from a communication channel. It is noted that the turbo coded signal can be generated using a quadratic polynomial permutation (QPP) interleave ($\pi$), as depicted in a block 1512.

The method 1500 continues by performing pre-processing to extract an encoded block from the turbo coded signal, as shown in a block 1520. The method 1500 continues by partitioning the encoded block into a plurality of sub-blocks, as shown in a block 1530. It is also noted that each sub-block itself includes a plurality of data.

The method 1500 then continues by storing the plurality of data of the plurality of sub-blocks into a plurality of memory banks, as shown in a block 1530. The method 1500 also continues by turbo decoding the encoded block (i.e., the data within each of the plurality of sub-blocks) using a plurality of decoding processors in accordance with parallel turbo decoding processing, as shown in a block 1550. The method 1500 also continues by generating best estimates of information bits encoded within the turbo coded signal, as shown in a block 1560.

Figure 16:
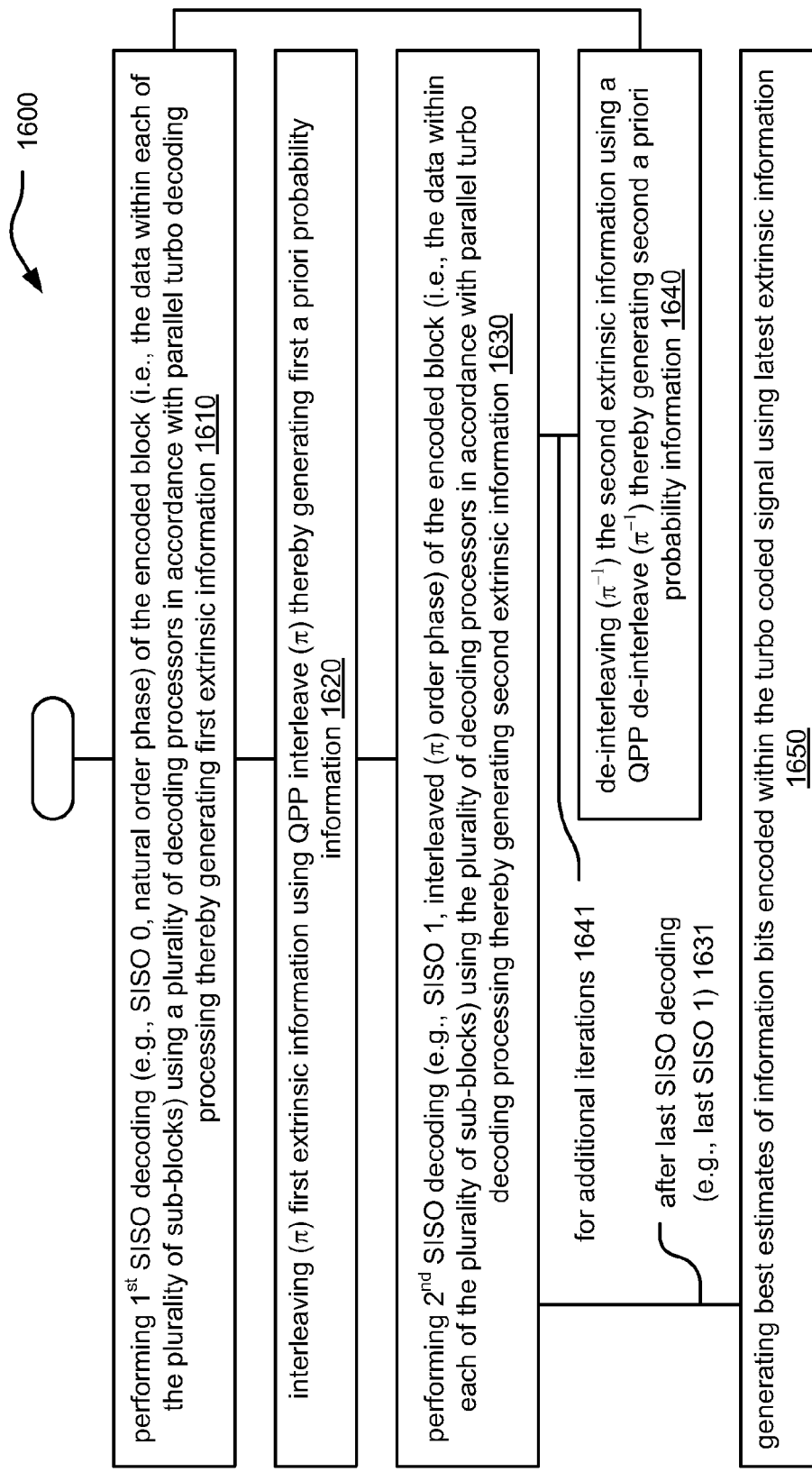
FIG. 16 illustrates an alternative embodiment of a method for decoding a turbo coded signal.

FIG. 16 illustrates an alternative embodiment of a method 1600 for decoding a turbo coded signal. Initially, in certain embodiments, the method 1600 can preliminarily perform analogous operations as described within blocks 1510, 1520, 1530, and 1540 of method 1500 of FIG. 15.

As shown in a block 1610, the method 1600 operates by performing $1^{st}$ SISO decoding (e.g., SISO 0, natural order phase) of the encoded block (i.e., the data within each of the plurality of sub-blocks) using a plurality of decoding processors in accordance with parallel turbo decoding processing thereby generating first extrinsic information, as shown in a block 1610. A plurality of data of a plurality of sub-blocks stored in and accessed from a plurality of memory banks.

The method 1600 then continues by interleaving ($\pi$) first extrinsic information using a quadratic polynomial permutation (QPP) interleave ($\pi$) thereby generating first a priori probability information, as shown in a block 1620.

The method 1600 then continues by performing $2^{nd}$ SISO decoding (e.g., SISO 1, interleaved ($\pi$) order phase) of the encoded block (i.e., the data within each of the plurality of sub-blocks) using the plurality of decoding processors in accordance with parallel turbo decoding processing thereby generating second extrinsic information, as shown in a block 1630.

When performing additional decoding operations as shown by reference numeral 1651, the method 1600 continues by de-interleaving ($\pi^{-1}$) the second extrinsic information using a quadratic polynomial permutation (QPP) de-interleave ($\pi^{-1}$) thereby generating second a priori probability information, as shown in a block 1640. The method 1600 then continues by returning to block 1610 for subsequent decoding iterations.

However, when a final decoding iteration has been performed (e.g., all of the SISO 0 and SISO 1 decoding operations have been performed, and particularly after a final SISO 1 decoding operation has been performed) as shown by reference numeral 1631, then the method 1600 continues by generating best estimates of information bits encoded within the turbo coded signal, as shown in a block 1650.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

REFERENCES

[1] C. Berrou, Y. Saouter, C. Douillard, S. Kerouédan, and M. Jézéquel, "Designing good permutations for turbo codes: towards a single model," 2004 *IEEE International Conference on Communications (ICC)*, Vol.: 1, pp: 341-345, 20-24 Jun. 2004.

[2] O. Y. Takeshita, "On maximum contention-free interleavers and permutation polynomials over integer rings," IEEE Trans. Information Theory, vol 52, No. 3, March 2006.

[3] A. Tarable, S. Benedetto and G. Montorsi "Mapping Interleaving Laws to Parallel Turbo and LDPC Decoder Architectures," *IEEE Trans. on Information Theory*, Vol. 50, No. 9, pp. 2002-2009, September 2004.

[4] A. Nimbalker, T. E. Fuja, D. J. Costello, Jr. T. K. Blankenship and B. Classon, "Contention-Free Interleavers," *IEEE ISIT* 2004, Chicago, USA, Jun. 27-Jul. 2, 2004.

[5] Ericsson, Motorola, QPP interleaver parameters, 3GPP TSG RAN WG1 #47bis R1-070484.

What is claimed is:

1. An apparatus, comprising:
a plurality of turbo decoders;
a plurality of memories; and
a processing module, connected to the plurality of turbo decoders and the plurality of memories, for performing a plurality of mappings of a collision-free modulation memory mapping between the plurality of turbo decoders and the plurality of memories; and wherein:
during each respective decoding cycle of a plurality of decoding cycles, each of the plurality of turbo decoders retrieving respective information from a respective one of the plurality of memories in accordance with a respective one of the plurality of mappings of the collision-free modulation memory mapping between the plurality of turbo decoders and the plurality of memories, decoding the respective information thereby generating respective updated information, and writing the respective updated information over the respective information in the respective one of the plurality of memories;

the plurality of turbo decoders employing most recently updated information within the plurality of memories thereby generating a best estimate of at least one bit encoded within a turbo coded signal; and when performing turbo decoding, at least one of the plurality of turbo decoders performing quadratic polynomial permutation (QPP) de-interleaving on extrinsic information thereby generating "a priori probability" (app) information for use in subsequent decoding processing.

2. The apparatus of claim 1, wherein:
the plurality of turbo decoders including a number of turbo decoders; and
the plurality of memories including the number of memories.

3. The apparatus of claim 1, wherein:
the plurality of turbo decoders including a first number of turbo decoders; and
the plurality of memories including a second number of memories.

4. The apparatus of claim 1, wherein a turbo decoder of the plurality of turbo decoders including:
a first soft-in/soft-out (SISO) decoder for:
  receiving a plurality of metrics associated with the turbo coded signal; and
  performing SISO decoding on the plurality of metrics thereby calculating first extrinsic information;
an interleaver module for performing QPP interleaving on the first extrinsic information thereby generating first "a priori probability" (app) information;
a second SISO decoder for performing SISO decoding on the first app information thereby generating second extrinsic information;
a de-interleaver module for performing QPP de-interleaving on the second extrinsic information thereby generating second app information; and
an output processor for processing most recent extrinsic information that has been generated by the second SISO decoder thereby generating best estimates of information bits encoded within the turbo coded signal.

5. The apparatus of claim 1, wherein:
the apparatus being a communication device operative within at least one of a satellite communication system, a wireless communication system, a wired communication system, and a fiber-optic communication system.

6. An apparatus, comprising:
a plurality of turbo decoders; and
a plurality of memories; and wherein:
during each respective decoding cycle of a plurality of decoding cycles, each of the plurality of turbo decoders retrieving respective information from a respective one of the plurality of memories in accordance with a respective one of a plurality of mappings of a collision-free modulation memory mapping between the plurality of turbo decoders and the plurality of memories, decoding the respective information thereby generating respective updated information, and writing the respective updated information over the respective information in the respective one of the plurality of memories; and the plurality of turbo decoders employing most recently updated information within the plurality of memories thereby generating a best estimate of at least one bit encoded within a turbo coded signal.

7. The apparatus of claim 6, wherein:
the collision-free modulation memory mapping including a first mapping between the plurality of turbo decoders and the plurality of memories during a first of the plurality of decoding cycles; and
the collision-free modulation memory mapping including a second mapping between the plurality of turbo decoders and the plurality of memories during a second of the plurality of decoding cycles.

8. The apparatus of claim 6, wherein:
the collision-free modulation memory mapping adaptively switching among the plurality of mappings as a function of time based on the plurality of decoding cycles associated with iterative decoding processing of the turbo coded signal.

9. The apparatus of claim 6, further comprising:
a processing module, connected to the plurality of turbo decoders and the plurality of memories, for performing the plurality of mappings of the collision-free modulation memory mapping between the plurality of turbo decoders and the plurality of memories.

10. The apparatus of claim 6, wherein:
when performing turbo decoding, at least one of the plurality of turbo decoders performing quadratic polynomial permutation (QPP) de-interleaving on extrinsic information thereby generating "a priori probability" (app) information for use in subsequent decoding processing.

11. The apparatus of claim 6, wherein:
the plurality of turbo decoders including a number of turbo decoders; and
the plurality of memories including the number of memories.

12. The apparatus of claim 6, wherein:
the plurality of turbo decoders including a first number of turbo decoders; and
the plurality of memories including a second number of memories.

13. The apparatus of claim 6, wherein a turbo decoder of the plurality of turbo decoders including:
a first soft-in/soft-out (SISO) decoder for:
  receiving a plurality of metrics associated with the turbo coded signal; and
  performing SISO decoding on the plurality of metrics thereby calculating first extrinsic information;
an interleaver module for performing interleaving on the first extrinsic information thereby generating first "a priori probability" (app) information; and
a second SISO decoder for performing SISO decoding on the first app information thereby generating second extrinsic information;
a de-interleaver module for performing de-interleaving on the second extrinsic information thereby generating second app information; and
an output processor for processing most recent extrinsic information that has been generated by the second SISO decoder thereby generating best estimates of information bits encoded within the turbo coded signal.

14. The apparatus of claim 6, wherein a turbo decoder of the plurality of turbo decoders including:
a first soft-in/soft-out (SISO) decoder for:
  receiving a plurality of metrics associated with the turbo coded signal; and performing SISO decoding on the plurality of metrics thereby calculating first extrinsic information;

an interleaver module for performing QPP interleaving on the first extrinsic information thereby generating first "a priori probability" (app) information;

a second SISO decoder for performing SISO decoding on the first app information thereby generating second extrinsic information;

a de-interleaver module for performing QPP de-interleaving on the second extrinsic information thereby generating second app information; and an output processor for processing most recent extrinsic information that has been generated by the second SISO decoder thereby generating best estimates of information bits encoded within the turbo coded signal.

15. The apparatus of claim 6, wherein:

the apparatus being a communication device operative within at least one of a satellite communication system, a wireless communication system, a wired communication system, and a fiber-optic communication system.

16. An apparatus, comprising:

a plurality of turbo decoders; and a plurality of memories; and wherein:

during each respective decoding cycle of a plurality of decoding cycles, each of the plurality of turbo decoders retrieving respective information from a respective one of the plurality of memories in accordance with a respective one of a plurality of mappings of a collision-free modulation memory mapping between the plurality of turbo decoders and the plurality of memories, decoding the respective information thereby generating respective updated information, and writing the respective updated information over the respective information in the respective one of the plurality of memories;

the plurality of turbo decoders employing most recently updated information within the plurality of memories thereby generating a best estimate of at least one bit encoded within a turbo coded signal;

the plurality of turbo decoders including a first number of turbo decoders;

the plurality of memories including a second number of memories; and the collision-free modulation memory mapping adaptively switching among the plurality of mappings as a function of time based on the plurality of decoding cycles associated with iterative decoding processing of the turbo coded signal.

17. The apparatus of claim 16, further comprising:

a processing module, connected to the plurality of turbo decoders and the plurality of memories, for performing the plurality of mappings of the collision-free modulation memory mapping between the plurality of turbo decoders and the plurality of memories.

18. The apparatus of claim 16, wherein a turbo decoder of the plurality of turbo decoders including:

a first soft-in/soft-out (SISO) decoder for:
receiving a plurality of metrics associated with the turbo coded signal; and
performing SISO decoding on the plurality of metrics thereby calculating first extrinsic information;

an interleaver module for performing interleaving on the first extrinsic information thereby generating first "a priori probability" (app) information; and a second SISO decoder for performing SISO decoding on the first app information thereby generating second extrinsic information;

a de-interleaver module for performing de-interleaving on the second extrinsic information thereby generating second app information; and an output processor for processing most recent extrinsic information that has been generated by the second SISO decoder thereby generating best estimates of information bits encoded within the turbo coded signal.

19. The apparatus of claim 16, wherein a turbo decoder of the plurality of turbo decoders including:

a first soft-in/soft-out (SISO) decoder for:
receiving a plurality of metrics associated with the turbo coded signal; and
performing SISO decoding on the plurality of metrics thereby calculating first extrinsic information;

an interleaver module for performing QPP interleaving on the first extrinsic information thereby generating first "a priori probability" (app) information;

a second SISO decoder for performing SISO decoding on the first app information thereby generating second extrinsic information;

a de-interleaver module for performing QPP de-interleaving on the second extrinsic information thereby generating second app information; and an output processor for processing most recent extrinsic information that has been generated by the second SISO decoder thereby generating best estimates of information bits encoded within the turbo coded signal.

20. The apparatus of claim 16, wherein:

the apparatus being a communication device operative within at least one of a satellite communication system, a wireless communication system, a wired communication system, and a fiber-optic communication system.

* * * * *